(12) United States Patent
Lim et al.

(10) Patent No.: US 11,456,335 B2
(45) Date of Patent: Sep. 27, 2022

(54) VERTICAL MEMORY DEVICES

(71) Applicant: SAMSUNG ELECTRONICS CO., LTD., Suwon-si (KR)

(72) Inventors: Jongho Lim, Yongin-si (KR); Hoosung Cho, Yongin-si (KR); Hongsoo Kim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 20 days.

(21) Appl. No.: 17/031,037

(22) Filed: Sep. 24, 2020

(65) Prior Publication Data
US 2021/0296324 A1    Sep. 23, 2021

(30) Foreign Application Priority Data
Mar. 20, 2020    (KR) .................. 10-2020-0034338

(51) Int. Cl.
| | |
|---|---|
| *H01L 27/24* | (2006.01) |
| *H01L 27/115* | (2017.01) |
| *H01L 21/768* | (2006.01) |
| *H01L 23/522* | (2006.01) |
| *H01L 27/11582* | (2017.01) |
| *H01L 27/11573* | (2017.01) |
| *H01L 27/11568* | (2017.01) |
| *H01L 27/112* | (2006.01) |
| *H01L 23/48* | (2006.01) |

(52) U.S. Cl.
CPC .... *H01L 27/2481* (2013.01); *H01L 21/76816* (2013.01); *H01L 23/481* (2013.01); *H01L 23/5226* (2013.01); *H01L 27/115* (2013.01); *H01L 27/11293* (2013.01); *H01L 27/11568* (2013.01); *H01L 27/11573* (2013.01); *H01L 27/11582* (2013.01)

(58) Field of Classification Search
CPC ......... H01L 27/11568; H01L 27/11573; H01L 27/11582; H01L 27/11565; H01L 27/2481; H01L 27/11293; H01L 23/5226; H01L 23/481; H01L 21/76816
See application file for complete search history.

(56) References Cited

U.S. PATENT DOCUMENTS

| | | |
|---|---|---|
| 8,178,917 B2 | 5/2012 | Tanaka et al. |
| 8,951,859 B2 | 2/2015 | Higashitani et al. |
| 9,111,592 B2 | 8/2015 | Maejima |

(Continued)

*Primary Examiner* — Joseph C. Nicely
(74) *Attorney, Agent, or Firm* — Volentine, Whitt & Francos, PLLC

(57) ABSTRACT

A vertical memory device includes circuit patterns of peripheral circuits on a substrate, the circuit patterns including a lower conductive pattern, cell stack structures over the circuit patterns and spaced apart in a first horizontal direction, wherein each of the cell stack structures includes gate electrodes spaced apart in a vertical direction, a first insulating interlayer covering the cell stack structures and a portion between the cell stack structures, a through via contact passing through the first insulating interlayer between the cell stack structures to contact an upper surface of the lower conductive pattern, at least one dummy through via contact passing through the first insulating interlayer between the cell stack structures and disposed adjacent to the through via contact, and upper wiring on the through via contact.

20 Claims, 27 Drawing Sheets

(56) References Cited

U.S. PATENT DOCUMENTS

| | | | |
|---|---|---|---|
| 9,520,562 B2* | 12/2016 | Xie | H01L 21/0228 |
| 9,698,155 B2 | 7/2017 | Shim et al. | |
| 10,115,667 B2 | 10/2018 | Yun et al. | |
| 10,319,729 B2 | 6/2019 | Hasegawa et al. | |
| 10,438,998 B2 | 10/2019 | Lee et al. | |
| 2019/0115361 A1* | 4/2019 | Kim | G11C 16/08 |
| 2019/0312051 A1* | 10/2019 | Park | H01L 23/5226 |
| 2020/0411542 A1* | 12/2020 | Yang | H01L 29/66545 |
| 2021/0036010 A1* | 2/2021 | Sim | H01L 27/11529 |

* cited by examiner

VERTICAL MEMORY DEVICES

CROSS-REFERENCE TO RELATED APPLICATION

This application claims priority under 35 USC § 119 to Korean Patent Application No. 10-2020-0034338 filed on Mar. 20, 2020 in the Korean Intellectual Property Office (KIPO), the subject matter of which is hereby incorporated by reference.

BACKGROUND

1. Field

Embodiments of the inventive concept relate to vertical memory devices. More particularly, embodiments of the inventive concept relate to vertical memory devices having a cell over peripheral (COP) structure.

2. Description of the Related Art

A vertical memory device having a COP structure includes one or more peripheral circuit(s) formed on a substrate and an arrangement of memory cells vertically disposed over the peripheral circuit(s). In this regard, vertical memory devices may include a through via contact passing through an insulating interlayer covering the memory cells and contacting wiring associated with the peripheral circuit(s).

SUMMARY

Embodiments of the inventive concept provide vertical memory devices having a COP structure and characterized by a reduced number of wiring defects.

Embodiments of the inventive concept provide vertical memory devices including dummy through via contact(s) adjacent to through via contact(s) that reduce the number of defects associated with the through via contact(s).

According to embodiments of the inventive concept, there is provided a vertical memory device including; circuit patterns of peripheral circuits on a substrate, the circuit patterns including a lower conductive pattern, cell stack structures over the circuit patterns and spaced apart in a first horizontal direction, wherein each of the cell stack structures includes gate electrodes spaced apart in a vertical direction, a first insulating interlayer covering the cell stack structures and a portion between the cell stack structures, a through via contact passing through the first insulating interlayer between the cell stack structures to contact an upper surface of the lower conductive pattern, at least one dummy through via contact passing through the first insulating interlayer between the cell stack structures and disposed adjacent to the through via contact, and upper wiring on the through via contact.

According to embodiments of the inventive concept, there is provided a vertical memory device including; circuit patterns including a lower conductive pattern, cell stack structures over the circuit patterns and spaced apart in a first horizontal direction, wherein each of the cell stack structures includes gate electrodes spaced apart in a vertical direction, a first insulating interlayer covering the cell stack structures and a portion between the cell stack structures, a through via contact passing through the first insulating interlayer between the cell stack structures to contact an upper surface of the lower conductive pattern and electrically connect a lower transistor, at least one dummy through via contact disposed adjacent to the through via contact, passing through the first insulating interlayer between the cell stack structures and electrically insulated from the lower transistor, and an upper wiring on the through via contact, wherein a ratio of an upper diameter of the through via contact and a distance between the through via contact and the at least one dummy through via contact falls in a range of about 1:0.5 to 10.

According to embodiments of the inventive concept, there is provided a method of manufacturing a vertical memory device. The method includes; forming circuits patterns of peripheral circuits on a substrate, wherein the circuit patterns include a lower transistor, a lower contact plug connected to the lower transistor and a lower conductive pattern connected to the lower contact plug, covering the circuit patterns with an lower insulating interlayer, forming opposing semiconductor bases separated by an insulating pattern on the lower insulating interlayer, forming respective mold structures having a stair-stepped shape on the semiconductor bases, wherein each mold structure includes a pad region and a cell region, forming a first insulating interlayer to cover the mold structures and the first insulating pattern, forming contact holes through the first insulating interlayer in respective pad regions of the mold structures, forming cell contact plugs in the contact holes, forming a through via hole through the first insulating interlayer and the insulating pattern to expose the lower conductive pattern, forming a plurality of dummy through via holes adjacently proximate to the through via hole through the first insulating interlayer and the insulating pattern to expose the lower conductive pattern, forming a through via contact in the through via hole and a plurality of dummy through via contacts in the plurality of dummy through via holes, forming a second insulating interlayer on the first insulating interlayer to cover upper surfaces of the cell contact plugs, the through via contact and the plurality of dummy through via contacts, selectively exposing the cell contact plugs and the through via contact through the second insulating interlayer, and electrically connecting an upper conductive pattern on the second insulating interlayer to the cell contact plugs and the through via contact through the second insulating interlayer.

BRIEF DESCRIPTION OF THE DRAWINGS

The inventive concept may be more clearly understood upon consideration of certain illustrated embodiments taken in conjunction with the accompanying drawings in which.

DETAILED DESCRIPTION

Throughout the written description and drawings like reference numbers and labels are used to denote like or similar elements and/or features. Throughout the written description certain geometric terms may be used to highlight relative relationships between elements, components and/or features with respect to certain some embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

In the description that follows, a direction substantially perpendicular to an upper surface of the substrate is defined as a "vertical direction," and two intersecting directions substantially parallel to the upper surface of the substrate are respectively defined as a "first horizontal direction" and a "second horizontal direction.

Figure 1A:
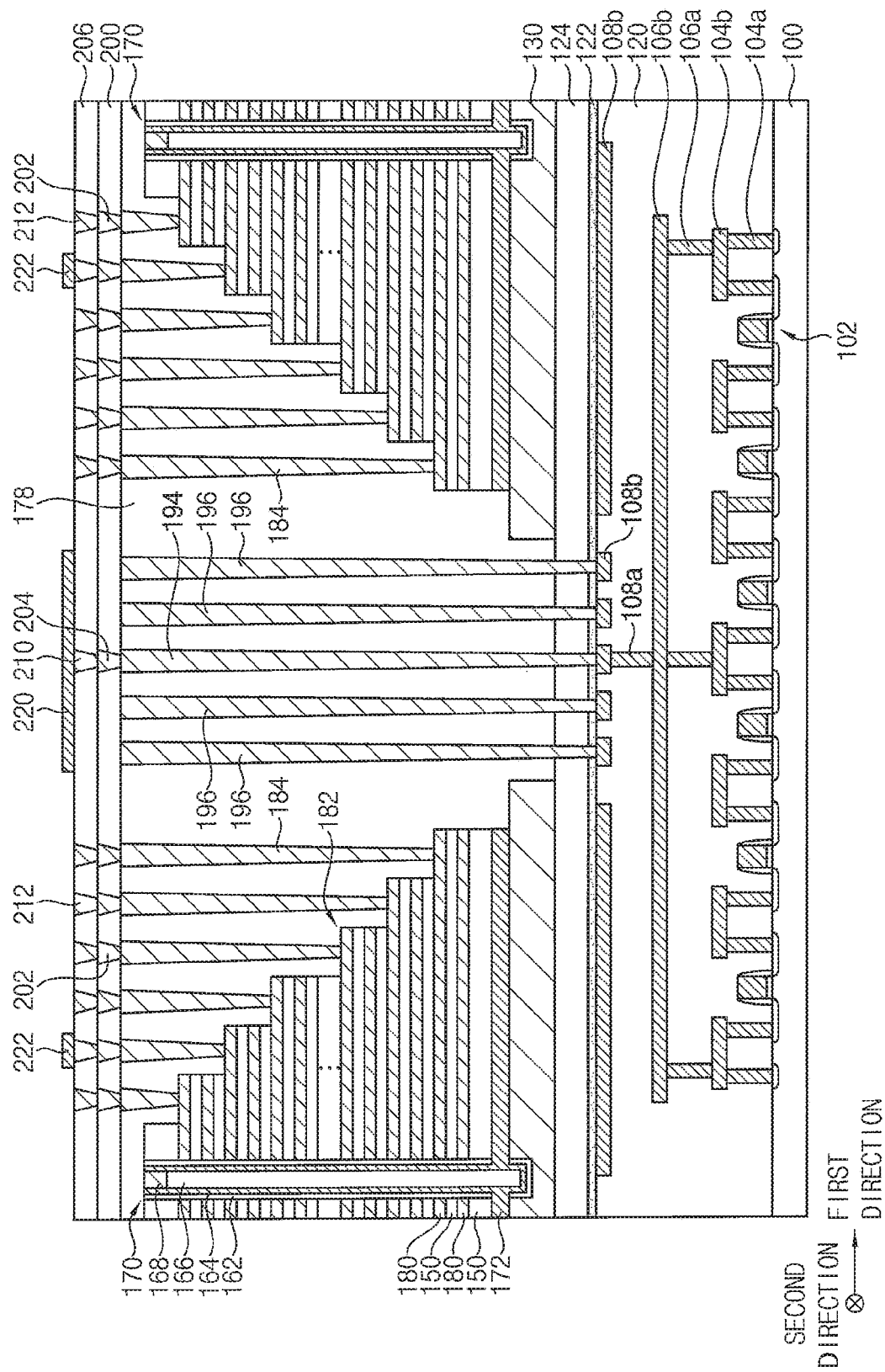
FIGS. 1A and 1B are respective, cross-sectional diagrams illustrating vertical memory devices according to embodiments of the inventive concept.
Figure 1B:
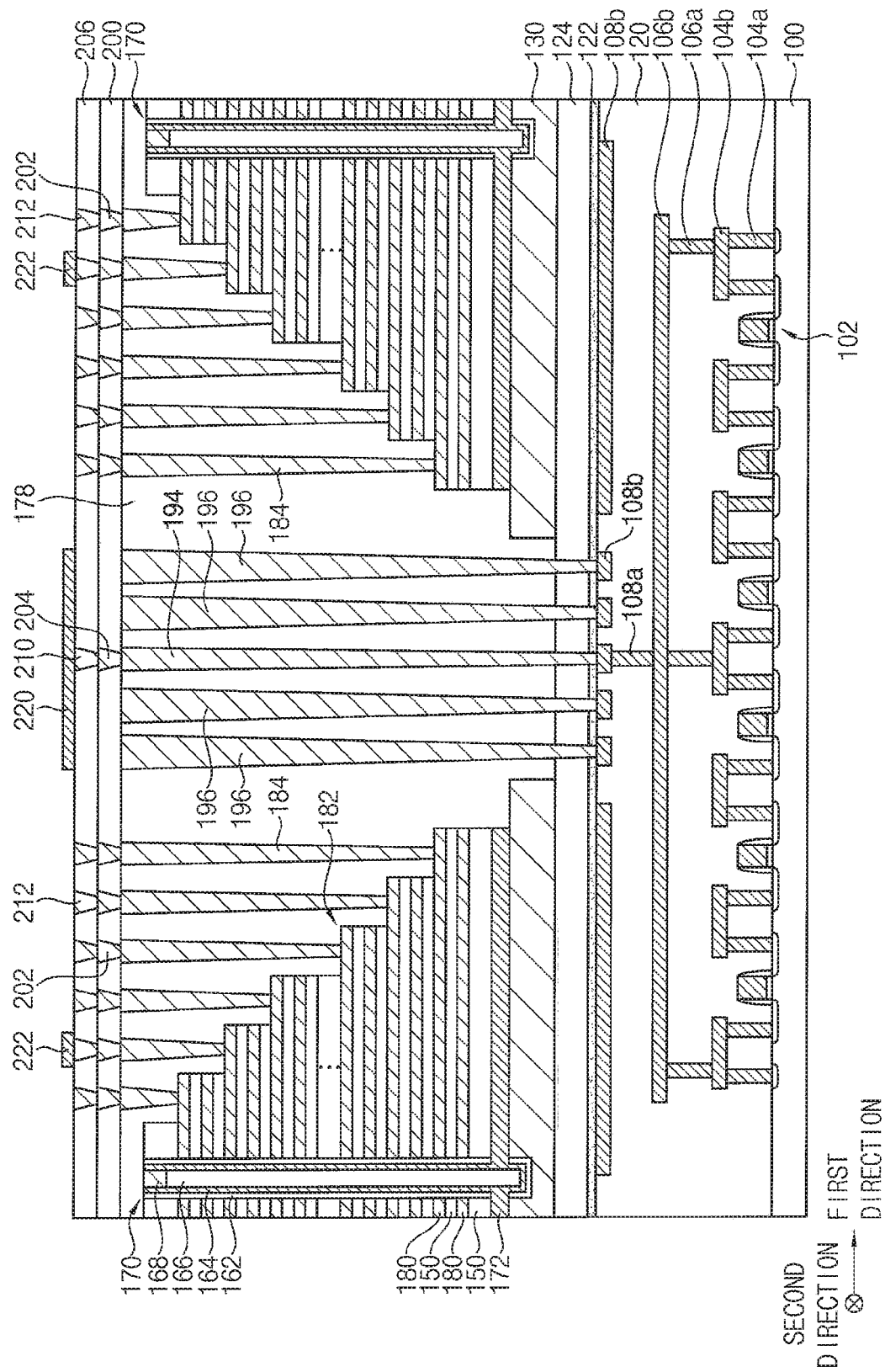
Figure 2:
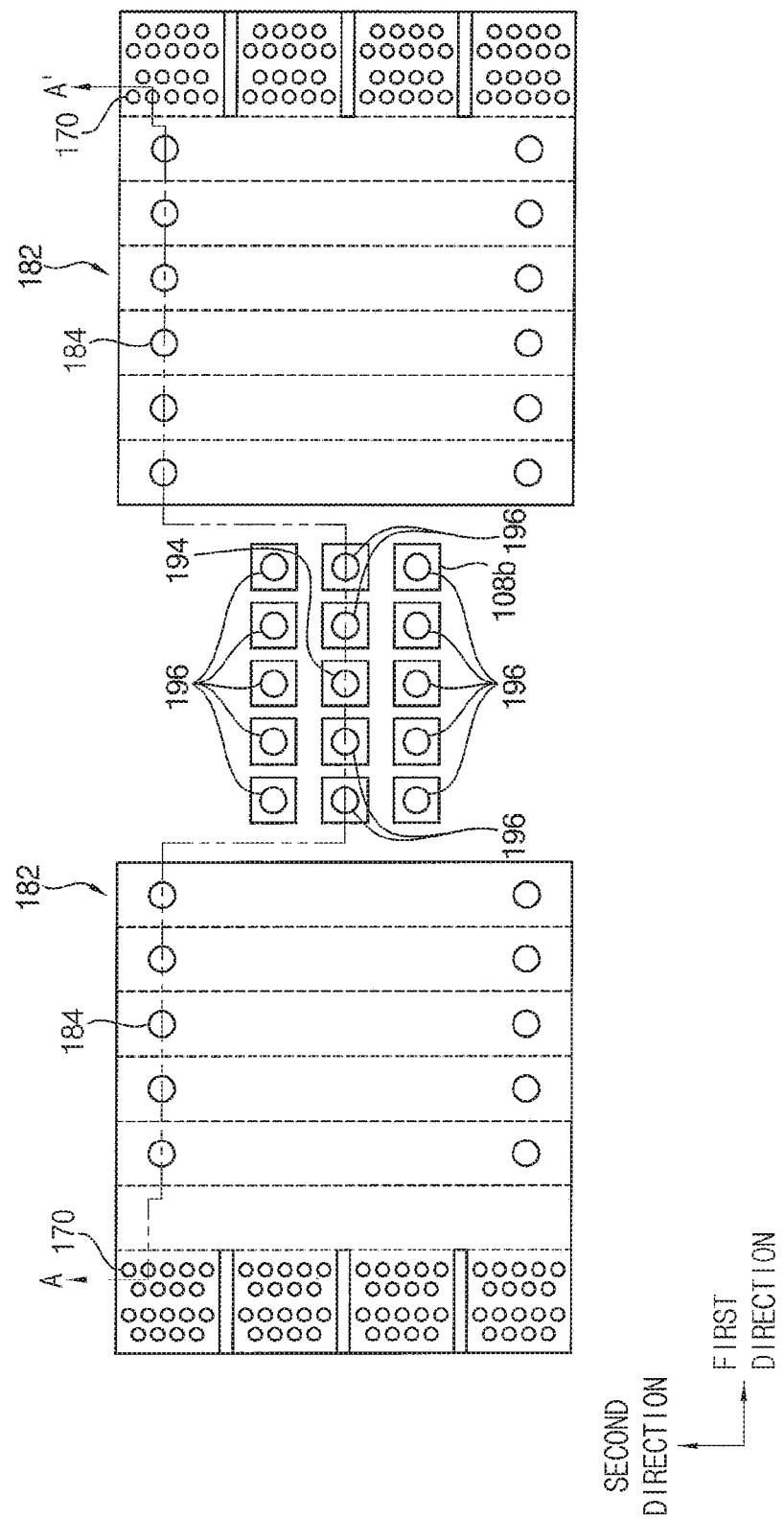
FIG. 2 is a plan (or top-down) diagram illustrating vertical memory devices according to embodiments of the inventive concept.

FIGS. 1A and 1B are respective, cross-sectional diagrams and FIG. 2 is a plan diagram collectively illustrating vertical memory devices according to embodiments of the inventive concept. Here, FIG. 1A and FIG. 1B are cross-sectional views taken along line A-A' of FIG. 2.

Referring to FIGS. 1A and 2, the vertical memory device may include circuit patterns, cell stack structures 182, a channel structure 170, a cell contact plug 184, a through via contact 194 and a dummy through via contact 196. The circuit patterns may be formed on a substrate 100, and the cell stack structures 182 may be formed over the circuit patterns.

The substrate 100 may include a semiconductor material such as silicon, germanium, or silicon-germanium, or a group III-V compound such as GaP, GaAs, GaSb, or the like. In some embodiments, the substrate 100 may be a silicon-on-insulator (SOI) substrate or a germanium-on-insulator (GOI) substrate.

The circuit patterns may constitute peripheral circuits for driving memory cells. The circuit patterns may include lower transistors 102, lower contact plugs 104a, 106a, and 108a, lower conductive patterns 104b, 106b, and 108b, etc. A first lower insulating interlayer 120 covering the circuit patterns may be formed on the substrate 100.

In some embodiments, the lower contact plugs 104a, 106a, 108a, and the lower conductive patterns 104b, 106b, 108b may be formed in multiple layers. In some embodiments, the lower contact plugs 104a, 106a, 108a and the lower conductive patterns 104b, 106b, 108b may be electrically connected to the lower transistors 102.

For example, the lower contact plugs and the lower conductive patterns may include a first lower contact plug 104a and a first lower conductive pattern 104b contacting the first lower contact plug 104a, a second lower contact plug 106a and a second lower conductive pattern 106b contacting the second lower contact plug 106a, a third lower contact plug 108a and a third lower conductive pattern 108b contacting the third lower contact plug 108a.

Hereinafter, a structure including the first, second and third lower contact plugs 104a, 106a, and 108a and the first, second and third lower conductive patterns 104b, 106b, and 108b are described. In this case, the third lower conductive patterns 108b may be disposed at an uppermost portion among lower wirings formed under a base semiconductor pattern 130.

In some embodiments, at least one of the third lower conductive patterns 108b may serve as a pad pattern contacting bottoms of the through via contact 194 and the dummy through via contact 196 subsequently described. Thus, certain third lower conductive patterns 108b may be vertically opposed to portions for forming the through via contact 194 and the dummy through via contact 196. For example, the through via contact 194 and the dummy through via contact 196 may be formed between the cell stack structures 182 in the first direction, and thus the third lower conductive pattern 108b may be vertically opposed to a region between the cell stack structures 182 in the first direction.

In some embodiments, the third lower conductive pattern 108b and the through via contact 194 may contact to each other, such that the lower transistors 102 and upper wirings may be electrically connected to each other.

In some embodiments, the lower transistors 102 may be electrically connected in series or in parallel by the first lower contact plug 104a and the first lower conductive pattern 104b. In addition, the lower transistors 102 connected to each other may be controlled by a voltage applied from the through via contact 194 to the first lower conductive pattern 104b via the third lower conductive pattern 108b. That is, a plurality of lower transistors 102 may be controlled by the voltage applied through one through via contact 194.

In some embodiments, upper surfaces of the third lower conductive patterns 108b and an upper surface of the first lower insulating interlayer 120 may be coplanar with each other.

An etch stop layer 122 may be formed on the third lower conductive patterns 108b and the first lower insulating interlayer 120. The etch stop layer 122 may include silicon nitride. A second lower insulating interlayer 124 may be formed on the etch stop layer 122.

Base semiconductor patterns 130 may be formed on the second lower insulating interlayer 124. In some embodiments, the base semiconductor patterns 130 may include polysilicon or single crystal silicon. In some embodiments, each of base semiconductor patterns 130 may be disposed to be vertically opposed a region for forming the cell stack structure 182. The cell stack structure 182 may not be disposed at a region between the base semiconductor patterns 130.

In some embodiments, a lower conductive pattern (not shown) may be formed on a bottom of the base semiconductor pattern 130. The lower conductive pattern may include metal and/or metal silicide. The lower conductive pattern may serve as a common source line (CSL).

The cell stack structure 182 including a plurality of memory cells may be formed on the base semiconductor pattern 130. The cell stack structure 182 may extend in the first direction. A plurality of cell stack structures 182 may be repeatedly arranged and spaced apart from each other in the first direction. Although not illustrated in FIG. 1A, the cell stack structures 182 may be arranged in the second direction.

An edge portion in the first direction of the cell stack structure 182 may have a stair-stepped shape. In the cell stack structure 182, a portion having the stair-stepped shape may be referred to as a "pad region," and another portion lacking the stair-stepped shape may be referred to as a "cell region."

The cell stack structure 182 may include a channel connection pattern 172, a plurality of gate electrodes and a plurality of insulation patterns. The gate electrodes may be formed on the channel connection pattern, and the gate electrodes may be spaced apart in the vertical direction. Each of the insulation patterns may be formed between the gate electrodes in the vertical direction. The channel connection pattern 172 may directly contact an upper surface of the base semiconductor pattern 130. The gate electrodes 180 and the insulation patterns 150 may be alternately arranged in the vertical direction on the channel connection pattern 172.

The gate electrodes 180 may include a metal. Each of the gate electrodes 180 may include a barrier pattern and a metal pattern. The metal pattern may include, e.g., a metal having low electrical resistance, such as tungsten, titanium, tantalum, platinum, or cobalt. The barrier pattern may include metal nitride, such as titanium nitride or tantalum nitride.

A channel structure 170 may pass through the gate electrodes 180 and the insulation patterns 150 in the cell region of the cell stack structure 182. The channel structure 170 may include a charge storage structure 162, a channel 164, a filling insulation pattern 166 and a capping pattern 168. The charge storage structure 162 may include a first blocking pattern, a charge storage pattern, and a tunnel insulation pattern sequentially stacked.

In some embodiments, the channel structure 170 may pass through the gate electrodes 180 and the insulation pattern 150 to extend into an inner portion of the base semiconductor pattern 130. In this case, the charge storage structure 162 may have a cutting portion at the channel connection pattern 172. A lower sidewall of the channel 164 may contact the channel connection pattern 172. Thus, the channel 164 may be electrically connected to the base semiconductor pattern 130 by the channel connection pattern 172.

Edge portions in the first direction of gate electrodes 180 in the pad region of the cell stack structure 182 may be disposed on different planes (i.e., disposed at different levels), respectively. The edge portions in the first direction of gate electrodes 180 may be exposed.

An upper surface of the second lower insulating interlayer 124 may be exposed at a region between neighboring cell stack structures 182 in the first direction.

A first insulating interlayer may cover the cell stack structures 182, and the second lower insulating interlayer 124 and the base semiconductor patterns 130 between the cell stack structures 182. An upper surface of the first insulating interlayer 178 may be substantially flat. Thus, a thickness (measured in the vertical direction) of the first insulating interlayer 178 disposed at the pad region of the cell stack structure 182 may be greater than a thickness of the first insulating interlayer 178 disposed at the cell region of the cell stack structure 182. Also, a thickness of the first insulating interlayer 178 disposed on the second lower insulating interlayer 124 may be greater than the thickness of the first insulating interlayer 178 disposed at the cell region of the cell stack structure 182.

Cell contact plugs 184 may pass through the first insulating interlayer 178 disposed at the pad region of the cell stack structure 182. The cell contact plugs 184 may contact the edge portions of gate electrodes 180, respectively. The cell contact plugs 184 may have different heights (measured in the vertical direction).

The through via contact 194 may pass through the first insulating interlayer 178 covering the portion between the cell stack structures, and the second insulating interlayer 124 and the etch stop layer 122 therebelow. The through via contact 194 may contact the third lower conductive pattern 108b.

The dummy through via contact 196 may pass through the first insulating interlayer 178 covering the portion between the cell stack structures, and the second insulating interlayer 124 and the etch stop layer 122 therebelow. The dummy through via contact 196 may contact the third lower conductive pattern 108b. The dummy through via contact 196 may be adjacent to the through via contact 194.

In some embodiments, the third lower conductive pattern 108b contacting the through via contact 194 may have an isolated shape. The third lower conductive pattern 108b contacting the dummy through via contact 196 may have an isolated shape. The third lower conductive pattern 108b contacting the through via contact 194 and the third lower conductive pattern 108b contacting the dummy through via contact 196 may be spaced apart from each other.

In some embodiments, the third lower conductive pattern 108b contacting the through via contact 194 may be electrically connected to the third lower contact plug 108a, the second lower conductive pattern 106b, the second lower contact plug 106a, the first lower conductive pattern 104b, and the first lower contact plug 104a. Therefore, the third lower conductive pattern 108b contacting the through via contact 194 may be electrically connected to the lower transistors 102 in the peripheral circuits.

In some embodiments, a bottom of the third lower conductive pattern 108b contacting the dummy through via contact 196 may not be connected to the third lower contact plug 108a. Therefore, the third lower conductive pattern 108b contacting the dummy through via contact 196 will not be electrically connected to the lower transistors 102 in the peripheral circuits.

The heights of the through via contact 194 and the dummy through via contact 196 may be substantially the same, and the heights of the through via contact 194 and the dummy through via contact 196 may be greater than the height of the cell contact plug 184. In some embodiments, the respective height(s) of the through via contact 194 and the dummy through via contact 196 may fall in a range of about 3 μm to about 20 μm. More particularly, the height(s) of the through via contact 194 and the dummy through via contact 196 may fall in a range of about 5 μm to about 10 μm.

Each of the through via contact 194 and the dummy through via contact 196 may have a sloping sidewall, such that an inner width (i.e., diameter) gradually decreases from a top portion towards a bottom portion. Therefore, in each of the through via contact 194 and the dummy through via contact 196, an upper diameter (i.e, a critical dimension) may be greater than a lower diameter.

In some embodiments, the upper diameter of each of the through via contact 194 and the dummy through via contact 196 may fall in a range of about 150 nm to about 400 nm.

In some embodiments, the lower diameter of each of the through via contact 194 and the dummy through via contacts 196 may fall in a range of about 50 nm to about 200 nm.

In some embodiments, in each of the through via contacts 194 and the dummy through via contacts 196, an aspect ratio (i.e, a ratio of the height and the lower diameter) based on the lower diameter may be 30 to 200:1. More particularly, the aspect ratio of each of the through via contact 194 and the dummy through via contact 196 may be 50 to 100:1.

The dummy through via contact 196 may not transfer electrical signals, but may be formed for preventing defects of the through via contact 194. Therefore, preferably, the dummy through via contact 196 may be adjacent to the through via contact 194.

In some embodiments, one through via contact 194 may be disposed, and a plurality of dummy through via contacts 196 may be adjacent to the one through via contact 194. In some embodiments, each of the dummy through via contacts 196 may be disposed in a pointwise symmetric pattern around the through via contact 194.

In some embodiments, the dummy through via contacts 196 may be spaced apart from the through via contact 194 in the first direction and/or second direction. In some embodiments, the dummy through via contacts 196 may be radially disposed with respect to the through via contact 194.

In some embodiments, a distance between the dummy through via contact 196 and the dummy through via contact 196 and a distance between the dummy through via contacts 196 may be substantially the same. In other embodiments, a distance between the dummy through via contact 196 and the dummy through via contact 196 and a distance between the dummy through via contacts 196 may be different.

In some embodiments, a ratio of the upper diameter of the through via contact 194 and the distance between the through via contact 194 and the dummy through via contact 196 (i.e., a diameter: a distance) may fall in a range of 1:0.5 to 10. That is, the dummy through via contact 196 may be disposed such that the ratio of the upper diameter of the through via contact 194 and the distance between the through via contact 194 and the dummy through via contact 196 fall in a range of about 1:0.5 to 10. If the dummy through via contact 196 is disposed at a distance between the through via contact 194 and the dummy through via contact 196 of 10 times or more of the diameter of the through via contact 194, defects in the through via contact 194 may not be prevented by the dummy through via contact 196. Further, if the dummy through via contact 196 is closely disposed such that the distance between the through via contact 194 and the dummy through via contact 196 is 0.5 times or less of the diameter of the through via contact 194, then the through via contact 194 and the dummy through via contact 196 may be connected to each other.

In some embodiments, the upper diameter of the through via contact 194 may be substantially the same as the upper diameter of the dummy through via contact 196.

In some embodiments of the inventive concept, like the one illustrated in FIG. 1B, the upper diameters of the through via contact 194 and the dummy through via contact 196 may be different. For example, the upper diameter of the dummy through via contact 196 may be greater than the upper diameter of the through via contact 194. Alternately, the upper diameter of the dummy through via contact 196 may be less than the upper diameter of the through via contact 194.

In some embodiments, each of the through via contact 194 and the dummy through via contact 196 may include a barrier pattern and a metal pattern. The barrier pattern may surround sidewalls and a bottom of the metal pattern. The metal pattern may include (e.g.,) a metal having low electrical resistance, such as tungsten, titanium, tantalum, platinum, or cobalt. The barrier pattern may include metal nitride, such as titanium nitride or tantalum nitride.

A second insulating interlayer 200 may be formed on the first insulating interlayer 178.

A first cell upper contact 202 and a first peripheral upper contact 204 may pass through the second insulating interlayer 200. The first cell upper contact 202 may contact an upper surface of the cell contact plug 184. The first peripheral upper contact 204 may contact an upper surface of the through via contact 194.

A third insulating interlayer 206 may be formed on the second insulating interlayer 200.

A second cell upper contact 212 and a second peripheral upper contact 210 may pass through the third insulating interlayer 206. The second cell upper contact 212 may contact an upper surface of the first cell upper contact 202. The second peripheral upper contact 210 may contact the first peripheral upper contact 204.

In some embodiments of the inventive concept, like the one illustrated in FIG. 1A, two upper contacts vertically stacked may be formed on each of the cell contact plug 184 and the through via contact 194. In some embodiments, one upper contact may be formed on each of the cell contact plug 184 and the through via contact 194, or three or more upper contacts vertically stacked may be formed on each of the cell contact plug 184 and the through via contact 194.

An upper contact may not be formed on the dummy through via contact 196. That is, an upper surface of the dummy through via contact 196 may contact an insulation material (e.g.,) the second insulating interlayer 200. As a result, electrical signals may not be transferred to the lower transistors 102 in the peripheral circuits by the dummy through via contact 196.

When upper contacts and/or wirings are formed to contact the dummy through via contact 196, a design or a layout of other wirings may be limited depending on arrangements of the upper contacts and wirings. However, as described above, the upper contacts and/or the wirings may not formed on the dummy through via contact 196, such that a degree of design freedom (e.g., the layout of layers or patterns formed over the dummy through via contact 196) may be increased.

A first upper conductive pattern 220 contacting an upper surface of the second peripheral upper contact 210 may be formed on the third insulating interlayer 206. A second upper conductive pattern 222 contacting an upper surface of the second cell upper contact 212 may be formed on the third insulating interlayer 206.

Thus, a voltage applied from the first upper conductive pattern 220 may be transferred to the lower transistors 102 in the peripheral circuits by the through via contact 194. As defects associated the through via contact 194 decrease, the plurality of lower transistors 102 connected to each other may be controlled by the voltage applied from the through via contact 194.

FIGS. 3 to 11 are related, cross-sectional diagrams illustrating in one example a method of manufacturing for vertical memory devices according to embodiments of the inventive concept.

Figure 3:
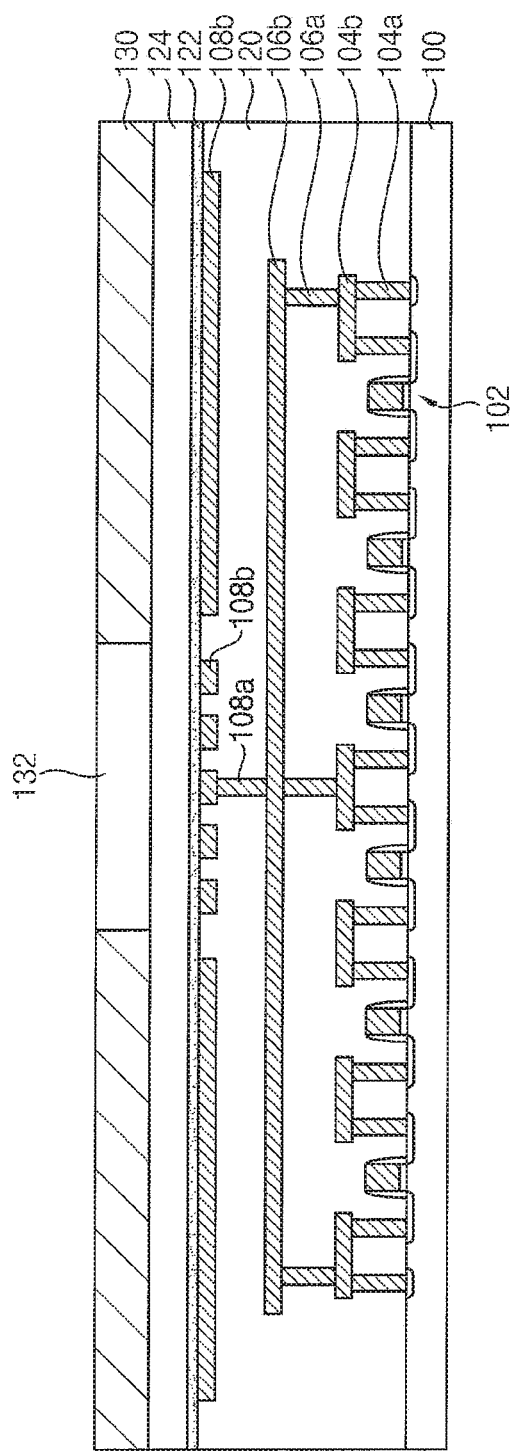
FIGS. 3, 4, 5, 6, 7, 8, 9, 10 and 11 (hereafter collectively, "FIGS. 3 to 11") are related cross-sectional diagrams illustrating in one example a method of manufacturing vertical memory devices according to embodiments of the inventive concept.

Referring to FIG. 3, circuit patterns constituting peripheral circuits may be formed on a substrate 100, and a first lower insulating interlayer 120 may be formed to cover the circuit patterns. The circuit patterns may include lower transistors 102, lower contact plugs 104a, 106a, and 108a and lower conductive patterns 104b, 106b, and 108b, etc.

In some embodiments, the lower contact plugs 104a, 106a, 108a and the lower conductive patterns 104b, 106b, 108b may be electrically connected to the lower transistors 102.

An upper surface of the third lower conductive pattern 108*b* and an upper surface of the first lower insulating interlayer 120 may be coplanar with each other. At least some of the third lower conductive patterns 108*b* may be vertically opposed to a region for forming a through via contact 194 and a dummy through via contact 196.

An etch stop layer 122 and a second lower insulating interlayer 124 may be formed on the first insulating interlayer 178.

Base semiconductor patterns 130 may be formed on the second lower insulating interlayer 124. A first insulation pattern 132 may be formed on the second lower insulating interlayer 124 to fill a space between the base semiconductor patterns 130. The upper surfaces of the base semiconductor patterns 130 and the first insulation pattern 132 may be coplanar with each other. The base semiconductor pattern 130 may be disposed to face a region in which a cell stack structure 182 is formed.

Figure 4:
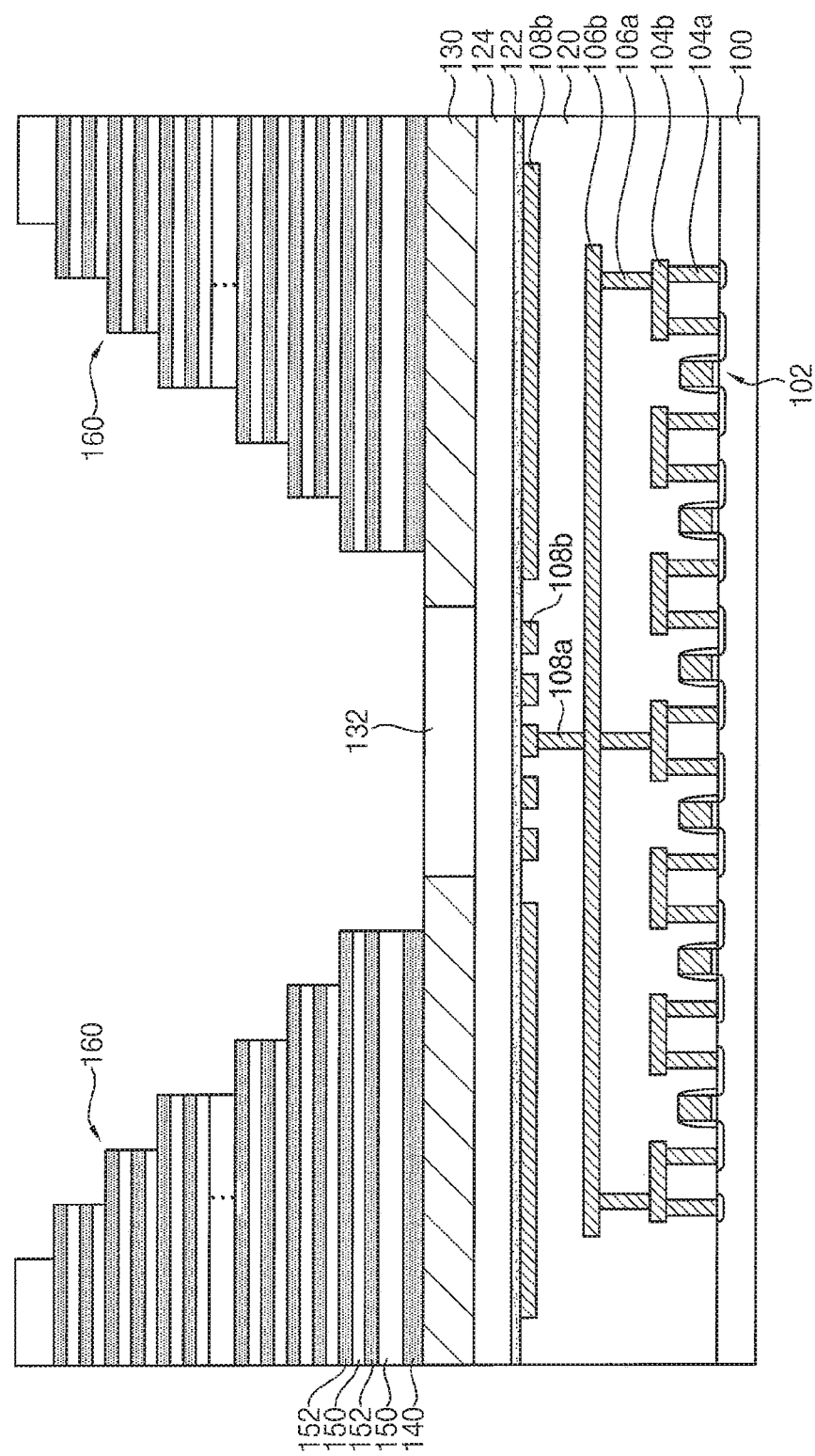

Referring to FIG. 4, sacrificial layers and insulation layers may be alternately and repeatedly stacked on the base semiconductor patterns 130 and the first insulation pattern 132. The insulation layer may include silicon oxide. The sacrificial layer may include a material having an etch selectivity with respect to the insulation layer. For example, the sacrificial layer may include (e.g.,) a nitride, such as silicon nitride. A lower sacrificial layer may be formed on the base semiconductor pattern 130, and the lower sacrificial layer may contact an upper surface of the base semiconductor pattern 130.

The sacrificial layers and insulation layers may be patterned to form mold structures 160. Each of the mold structures 160 may include sacrificial patterns 152 and insulation patterns 150 alternately and repeatedly stacked. A lower sacrificial pattern 140 may be disposed at a lowermost portion of the mold structure 160.

Each of the mold structure 160 may be formed on the base semiconductor pattern 130. Each of the mold structures 160 may have a line shape extending in the first direction.

The mold structures 160 may be spaced apart in the first direction. Each of the mold structures 160 may have an edge portion in the first direction having a stair-stepped shape.

Figure 5:
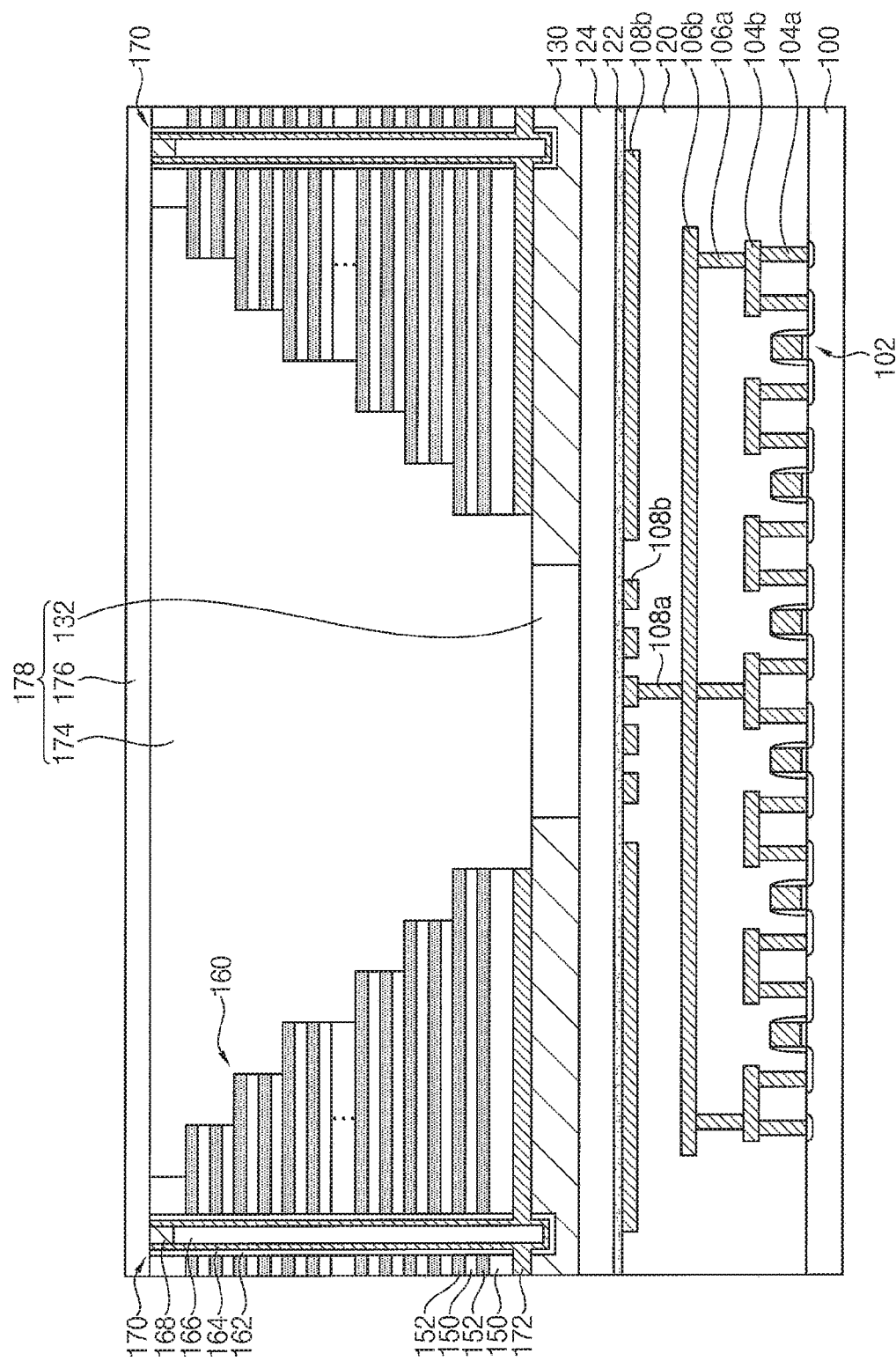

Referring to FIG. 5, a second insulation layer 174 may be formed to cover the mold structures and the base semiconductor pattern 130 and the first insulation pattern 132 between the mold structures 160. An upper surface of the second insulation layer 174 may be planarized by a planarization process. Thereafter, a third insulation layer 176 may be formed on the second insulation layer 174. The first insulation pattern 132, the second insulation layer 174, and the third insulation layer 176 may include silicon oxide. The first insulation pattern 132, the second insulation layer 174 and the third insulation layer 176 may include the same material, so that a merged layer including the first insulation pattern 132, the second insulation layer 174, and the third insulation layer 176 may be referred to as a first insulating interlayer 178.

A preliminary channel structure may be formed through the first insulating interlayer 178 and the mold structure 160 in the cell region, and the preliminary channel structure may extend to the base semiconductor pattern 130. The preliminary channel structure may include a preliminary charge storage structure, a channel 164, a filling insulation pattern 166 and a capping pattern 168.

The lower sacrificial pattern 140 of the mold structure 160 may be removed to form a gap. A portion of the preliminary charge storage structure exposed by the gap may be removed to form a charge storage structure 162. Thereafter, a channel connection pattern 172 may be formed to fill the gap. The channel connection pattern 172 may include (e.g.,) polysilicon. Therefore, the channel connection pattern 172 may contact a sidewall of the channel 164. The channel 164 and the channel connection pattern 172 may be electrically connected to each other. Further, a bottom of the channel connection pattern 172 may directly contact the upper surface of the base semiconductor pattern 130.

Figure 6:
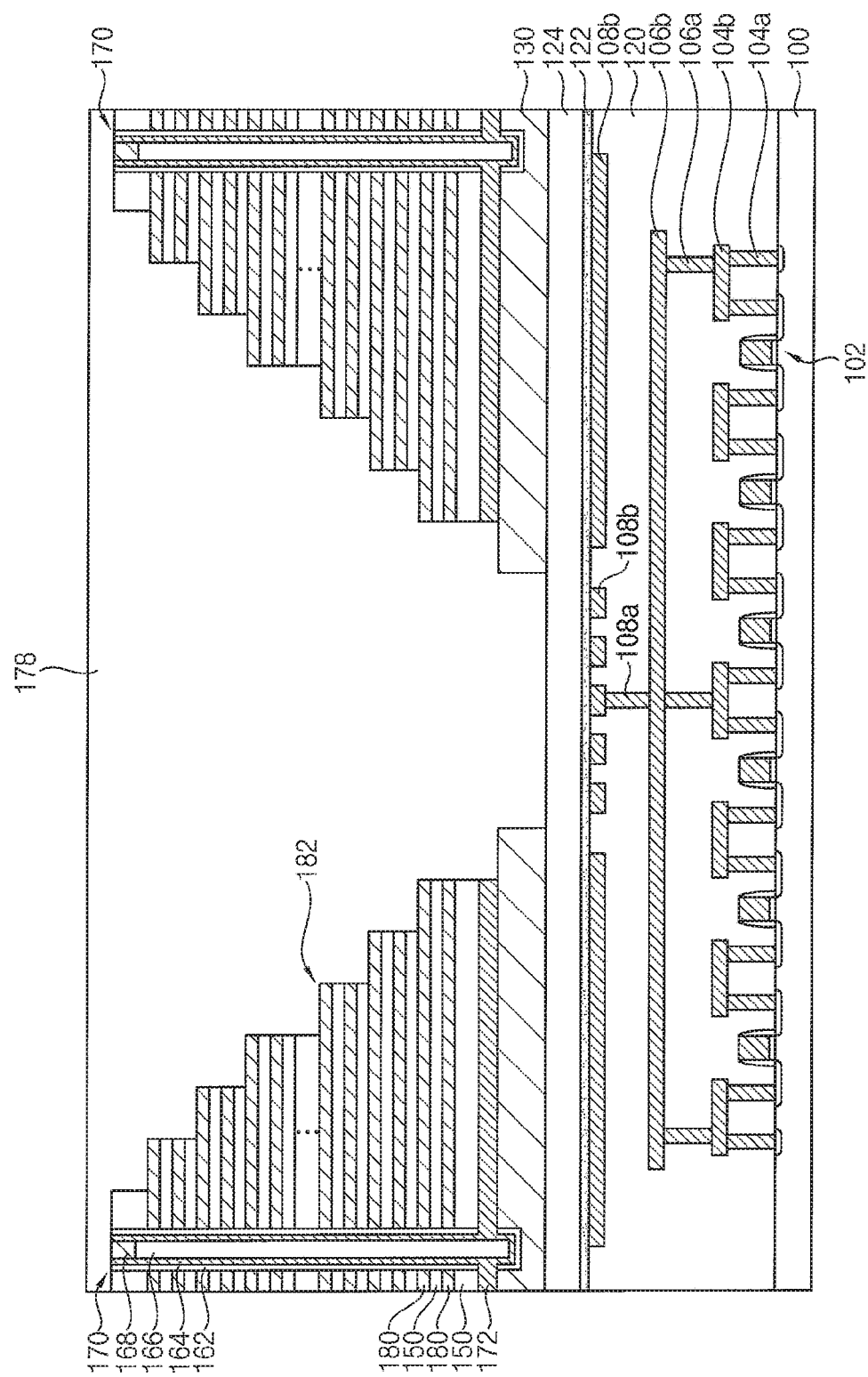

Referring to FIG. 6, the sacrificial patterns 152 of the mold structures 160 may be removed to form gaps between the insulation patterns 150 in the vertical direction. A conductive material may fill the gaps to form a gate electrode 180 in each of the gaps. The gate electrode 180 may include a barrier pattern and a metal pattern.

Therefore, the mold structures 160 may be replaced into cell stack structures 182. The cell stack structure 182 may include the channel connection pattern 172, the gate electrodes 180 and the insulation patterns 150. The gate electrodes 180 may be formed over the channel connection pattern 172, and the insulation patterns 150 may be formed between the gate electrodes 180. The gate electrodes 180 may be spaced apart from each other in the vertical direction. The gate electrodes 180 and the insulation patterns 150 may be alternately stacked in the vertical direction. An edge portion in the first direction of the cell stack structure 182 may have a stair-stepped shape.

Figure 7:
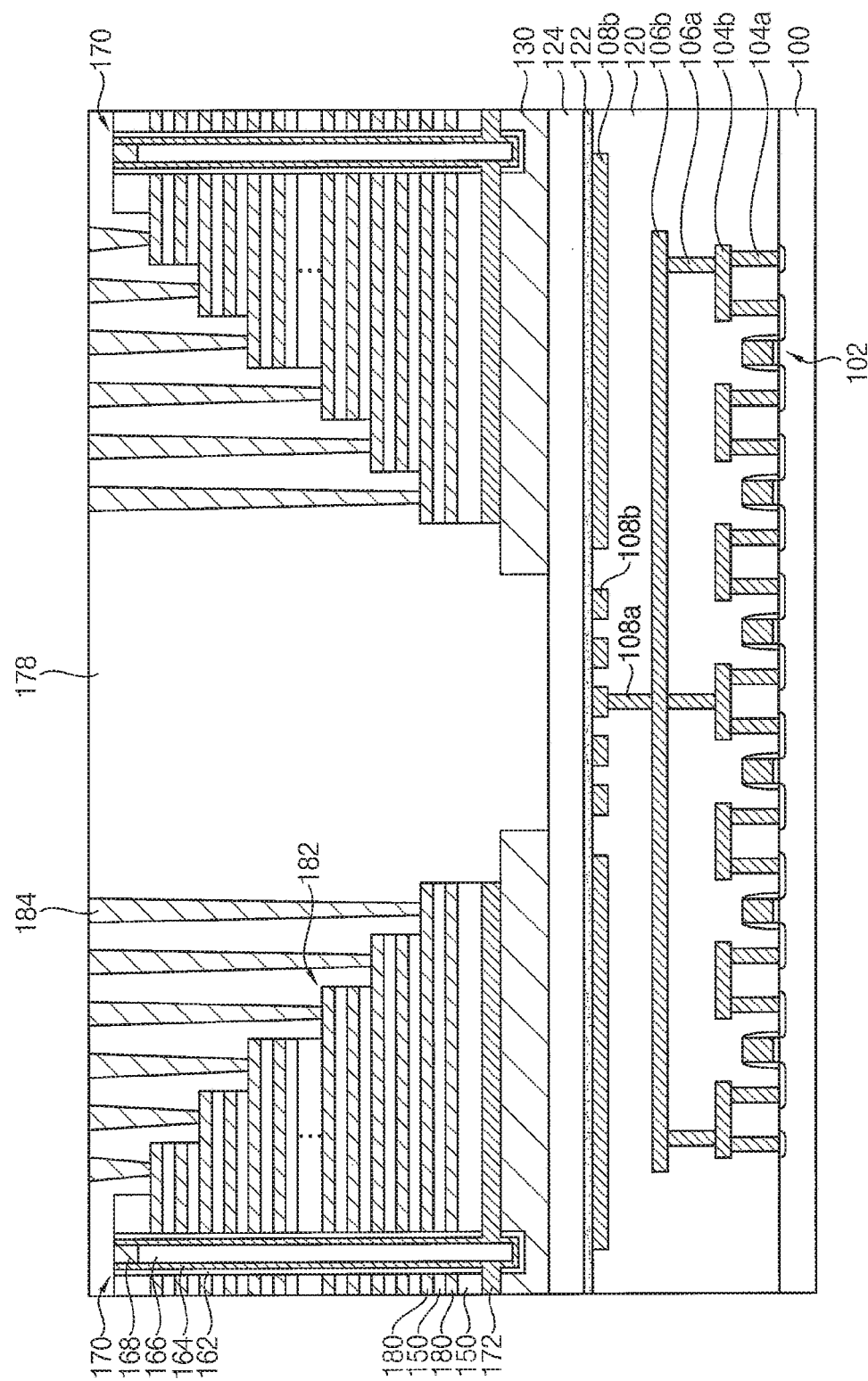

Referring to FIG. 7, first contact holes may be formed through the first insulating interlayer 178 in the pad region. The first contact holes may expose upper surfaces of edge portions of the gate electrodes 180. A conductive material may fill the first contact holes to form cell contact plugs 184 contacting the gate electrodes 180 in the cell stack structure 182.

Figure 8:
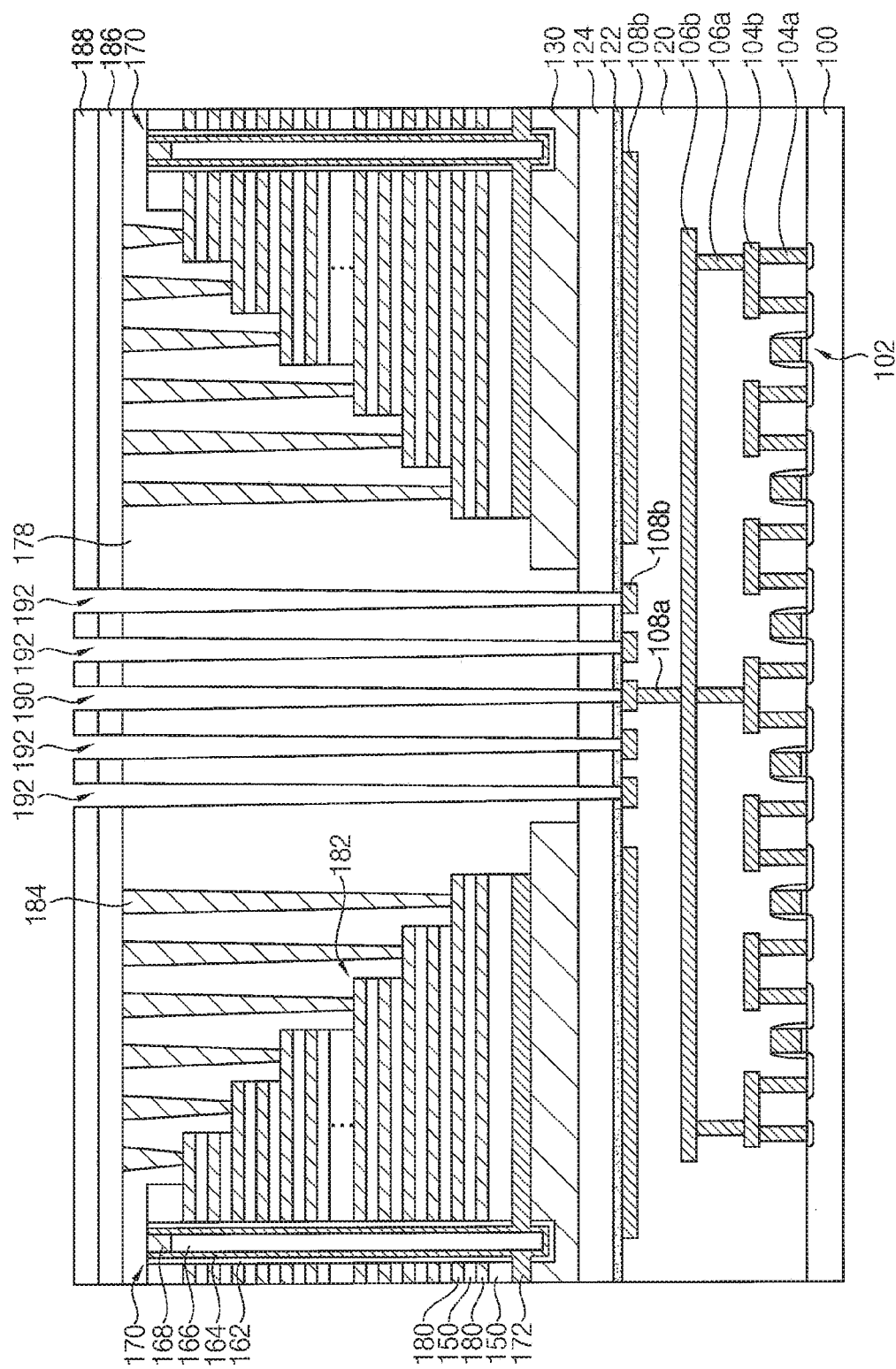

Referring to FIG. 8, the first insulating interlayer 178, the second lower insulating interlayer 124 and the etch stop layer 122 between the cell stack structures 182 may be sequentially etched to form a through via hole 190 and a dummy through via hole 192. In some embodiments, a plurality of dummy through via holes 192 may be formed to be adjacent to one through via hole 190.

In this regard, a hard mask layer may be formed on the first insulating interlayer 178 and the cell contact plug 184. Thereafter, a photoresist layer may be coated on the hard mask layer, and a photo process may be performed to form a photoresist pattern 188. The photoresist pattern 188 may include openings at regions for forming the through via hole 190 and dummy through via holes 192.

If the dummy through via holes 192 adjacent to the through via hole 190 are not formed, the photoresist pattern may include an isolated, single opening in a region for forming the through via hole 190. However, when the photoresist pattern including the isolated, single opening is formed, a photographing process used to form the opening having a target diameter may be difficult to perform. Therefore, the formation of an isolated, single through via hole having the target diameter using the photoresist pattern is deemed ill advised.

In some embodiments, the photoresist pattern 188 may include openings at a region for forming the through via hole 190 and the dummy through via holes 192. Thus, the photographing process may be readily performed, such that each of the openings has a target diameter. Therefore, the through via hole 190 and the dummy through via holes 192 having target diameters may be formed using the photoresist pattern 188.

The hard mask layer may be etched using the photoresist pattern 188 as an etch mask to form a hard mask 186.

Thereafter, the first insulating interlayer 178, the second lower insulating interlayer 124, and the etch stop layer 122 between the cell stack structures 182 may be sequentially etched using the hard mask 186 as an etch mask. In the etching process, the third lower conductive pattern 108b may be hardly etched. Thus, the through via hole 190 and the dummy through via holes 192 exposing the third lower conductive patterns 108b may be formed by the etching process.

The etching process may include an anisotropic etching process. The etching process may include plasma etching using etching gas.

In some embodiments, a total height of the etched layers in which the through via hole 190 and the dummy through via holes 192 are formed may fall in a range of about 3 μm to about 20 μm. More particularly, the total height of the etched layers in which the through via hole 190 and the dummy through via holes 192 are formed may fall in a range of about 5 μm to about 10 μm.

Each of the through via hole 190 and the dummy through via holes 192 may have a sloped sidewall, such that the respective diameter(s) gradually decrease from a top portion towards a bottom portion. In some embodiments, an upper diameter of each of the through via hole 190 and the dummy through via holes 192 may fall in a range of about 150 nm to about 400 nm. More particularly, a lower diameter for each of the through via hole 190 and the dummy through via holes 192 may fall in a range of about 50 nm to about 200 nm.

In some embodiments, each of the through via holes 190 and the dummy through via holes 192 may be formed with an aspect ratio (based on the lower diameter) ranging from between about 30 to 200:1. More particularly, each of the through via holes 190 and the dummy through via holes 192 may be formed with an aspect ratio (based on the lower diameter) ranging from between about 50 to 100:1.

As described above, the total height of the etched layers in which the through via hole 190 and the dummy through via holes 192 are formed may be great, and the upper diameters of the through via hole 190 and the dummy through via holes 192 may be quite small.

Hence, if the dummy through via holes 192 adjacent to the through via hole 190 are not formed, an isolated, single through via hole 190 may be formed using the plasma etching process. However, when the plasma etching process is used to form the isolated, single through via hole 190, etching gases may not be uniformly introduced into a lower portion of the through via hole 190 due to the decreasing area of the gas inlet (i.e., the through via hole). Therefore, a lower portion of the isolated, single through via hole 190 may not be properly etched, such that a defect (e.g., a not-open defect) occurs and the third lower conductive pattern 108b is not properly exposed by a bottom of the isolated, single through via hole 190.

Accordingly, in some embodiments of the inventive concept, the through via hole 190 and the dummy through via holes 192 may be collectively formed using the plasma etching process. During the plasma etching process, etching gases may be introduced into the through via hole 190 and the dummy through via holes 192. Therefore, the etching gases may be more uniformly introduced into lower portions of the through via hole 190 and the dummy through via holes 192 because the number and resulting area of gas inlets (i.e., the through via hole, plus the dummy through via holes) is increased allowing a better flow of etching gases. Therefore, the third lower conductive pattern 108b may be readily exposed by the through via hole 190 and the dummy through via holes 192, and not-open defects associated with the through via hole 190 and the dummy through via holes 192 may be reduced.

Figure 9:
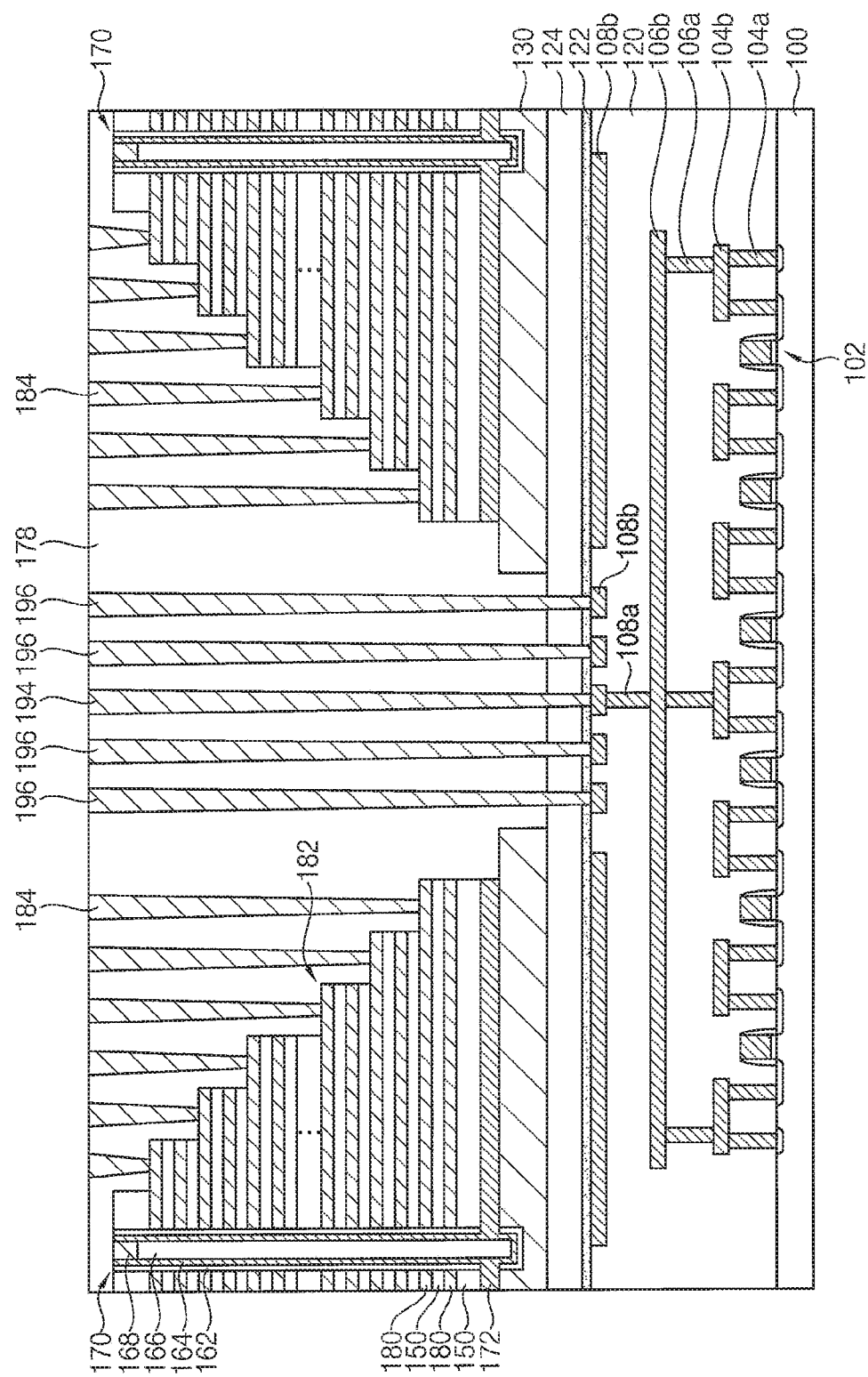

Referring to FIG. 9, a conductive material may be used to fill the through via hole 190 and the dummy through via holes 192 in order to form a through via contact 194 filling the through via hole 190 and the dummy through via contacts 196 filling the dummy through via holes 192. Each of the through via contact 194 and the dummy through via contact 196 may include a barrier pattern and a metal pattern.

More particularly, a barrier metal layer may be conformally formed on inner surfaces of the through via hole 190 and the dummy through via holes 192 and an upper surfaces of the hard mask 186. A metal layer may be formed on the barrier metal layer to completely fill the through via hole 190 and the dummy through via holes 192. Thereafter, the upper portions of the metal layer and the barrier metal layer and the hard mask 186 may be planarized until upper surfaces of the first insulating interlayer 178 and the cell contact plug 184 may be exposed to form the through via contact 194 and the dummy through via contacts 196. The planarization process may include a chemical mechanical polishing process and/or an etchback process.

Figure 10:
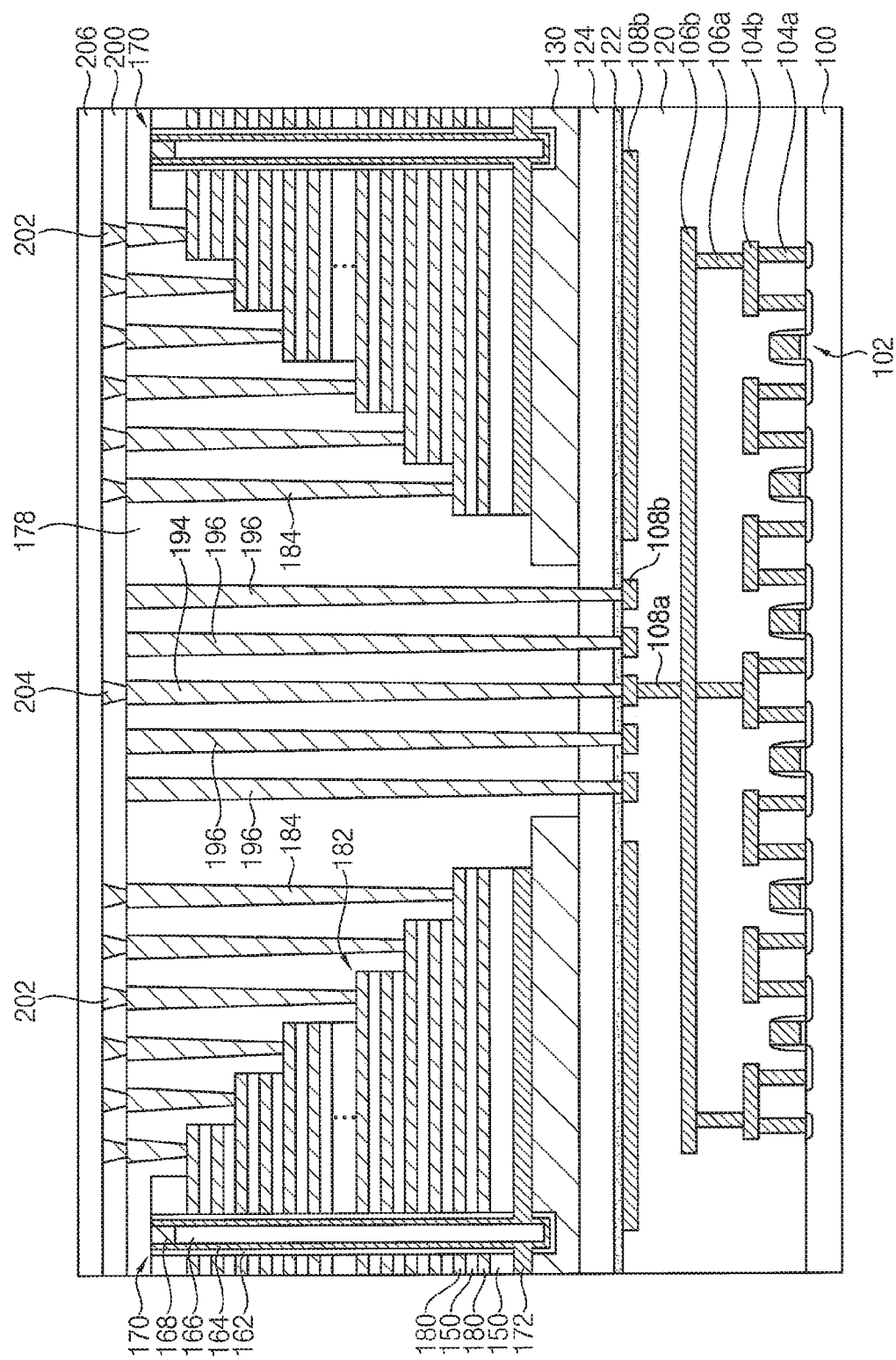

Referring to FIG. 10, a second insulating interlayer 200 may be formed on the first insulating interlayer 178.

The second insulating interlayer 200 may be etched to form a first hole and a second hole passing through the second insulating interlayer 200. The first hole may expose the upper surface of the cell contact plug 184, and the second hole may expose an upper surface of the through via contact 194. During the etching process, hole(s) variously exposing an upper surface of the dummy through via contact 196 will not be formed.

A conductive material may then be used to fill the first and second holes to form a first cell upper contact 202 and a first peripheral upper contact 204. The first cell upper contact 202 may contact the upper surface of the cell contact plug 184. The first peripheral upper contact 204 may contact the upper surface of the through via contact 194.

A third insulating interlayer 206 may then be formed on the second insulating interlayer 200.

Figure 11:
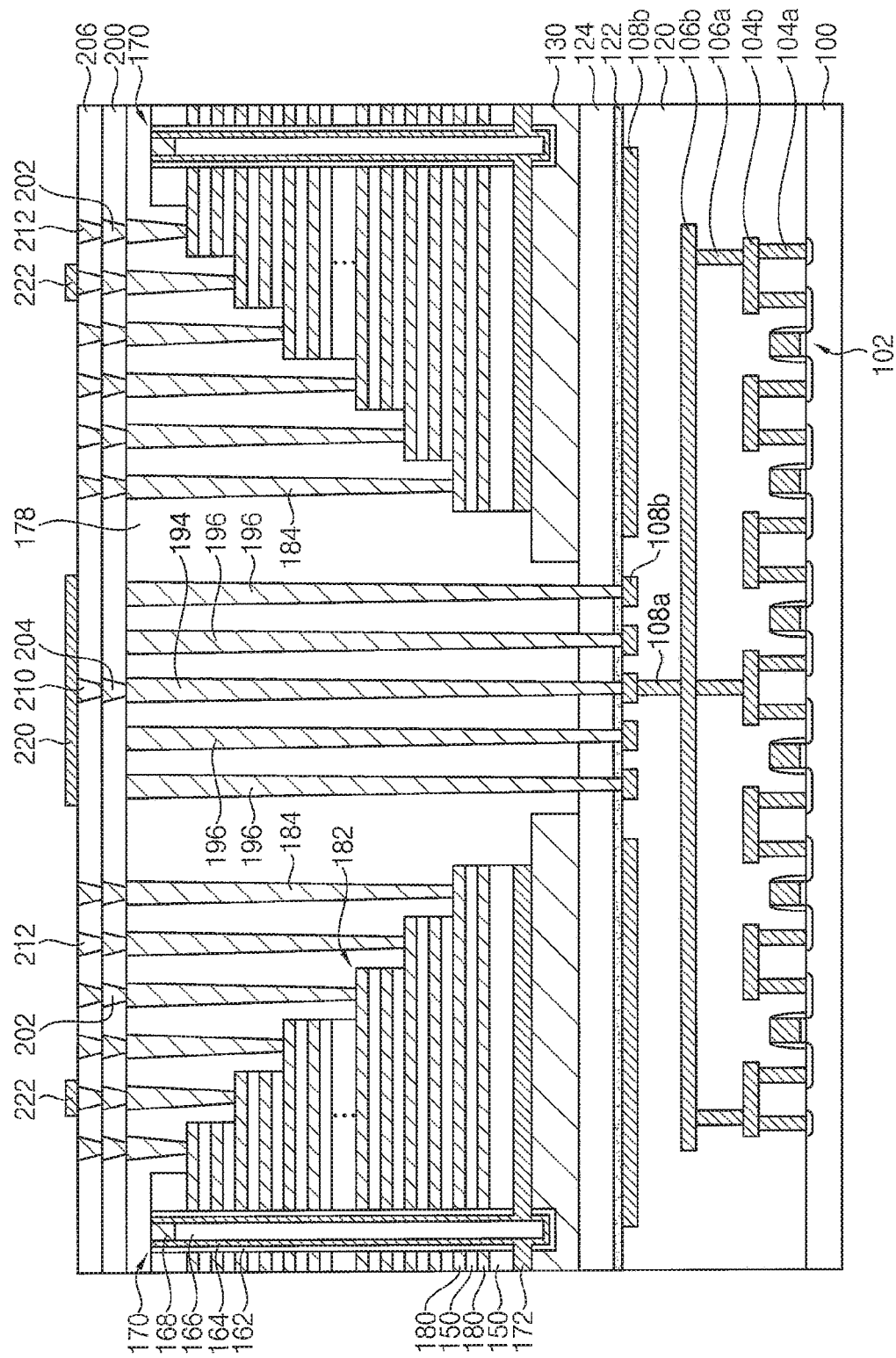

Referring to FIG. 11, the third insulating interlayer 206 may be etched to form a third hole exposing an upper surface of the first cell upper contact 202 and a fourth hole exposing an upper surface of the first peripheral upper contact 204.

Here again, a conductive material may be used to fill the third and fourth holes to form a second cell upper contact 212 and a second peripheral upper contact 210. The second cell upper contact 212 may contact the upper surface of the first cell upper contact 202. The second peripheral upper contact 210 may contact the upper surface of the first peripheral upper contact 204.

A first upper conductive pattern 220 contacting an upper surface of the second peripheral upper contact 210 may be formed on third insulating interlayer 206. The second upper conductive pattern 222 contacting an upper surface of the second cell upper contact 212 may be formed on the third insulating interlayer 206.

Hereinafter, various vertical memory devices according to embodiments of the inventive concept including dummy through via contacts 196 adjacent to the through via contact 194 will be described in relation to the cross-sectional diagrams of FIGS. 12, 13, 14, 15 and 16.

Figure 12:
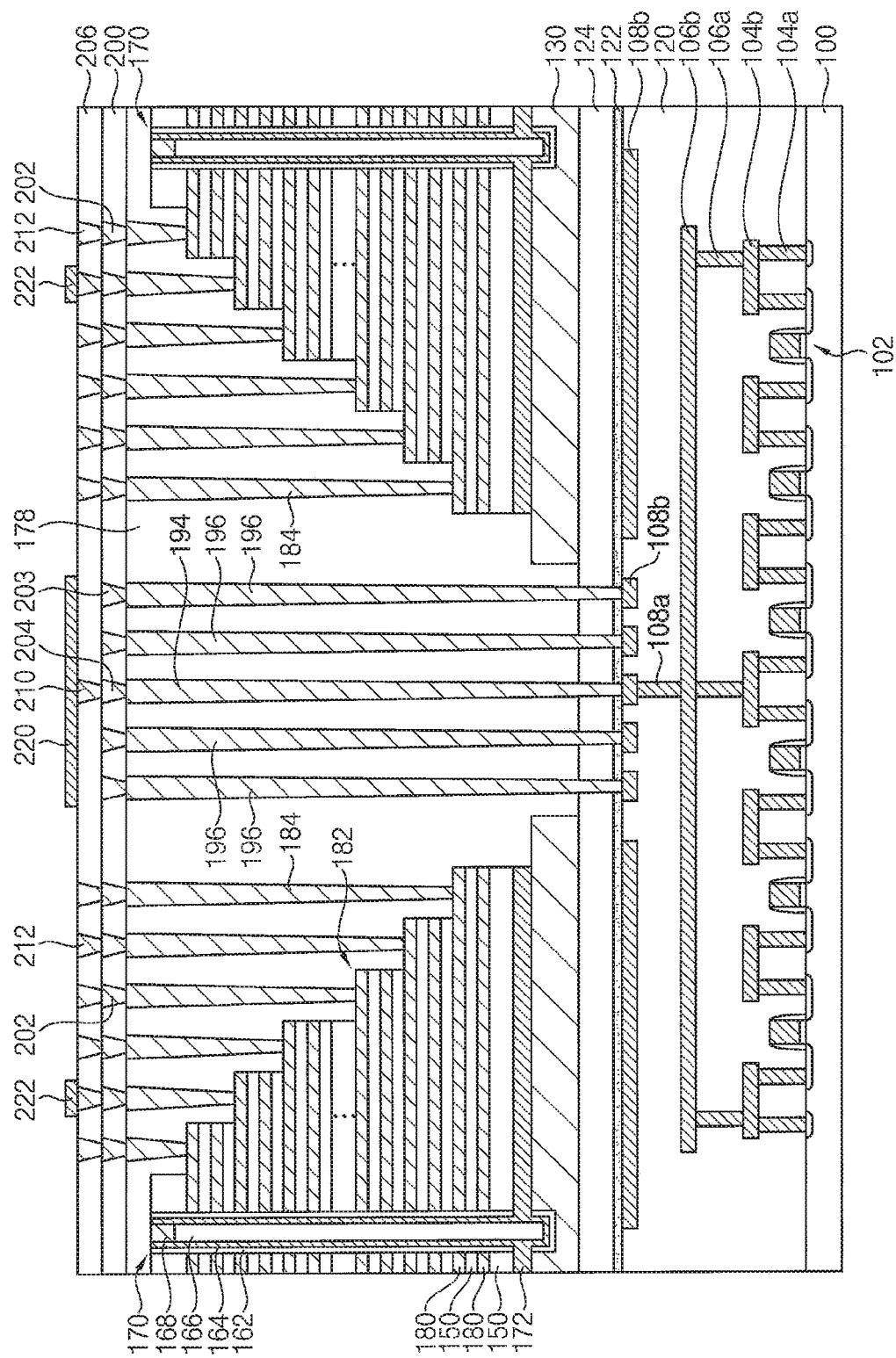
FIGS. 12, 13, 14, 15 and 16 are respective, cross-sectional diagrams illustrating various vertical memory devices according to embodiments of the inventive concept.

The vertical memory device shown in FIG. 12 is substantially the same as the vertical memory device shown in FIGS. 1A and 2, except that an upper dummy contact is further included.

Referring to FIG. 12, a first cell upper contact 202, a first peripheral upper contact 204 and an upper dummy contact 203 may pass through the second insulating interlayer 200.

The first cell upper contact 202 may contact an upper surface of the cell contact plug 184. The first peripheral upper contact 204 may contact an upper surface of the through via contact 194. In addition, the upper dummy contact 203 may contact the upper surface of the dummy through via contact 196. However, a contact may not be formed on the upper dummy contact 203. Therefore, the dummy through via contact 196 may be electrically floated. An upper surface of the upper dummy contact 203 may only contact an insulation material, e.g., the third insulating interlayer 206. Therefore, electrical signals may not be transferred by the upper dummy contact 203 and the dummy through via contact 196. That is, the dummy through via contact 196 and the upper dummy contact 203 may serve as one dummy contact structure.

Figure 13:
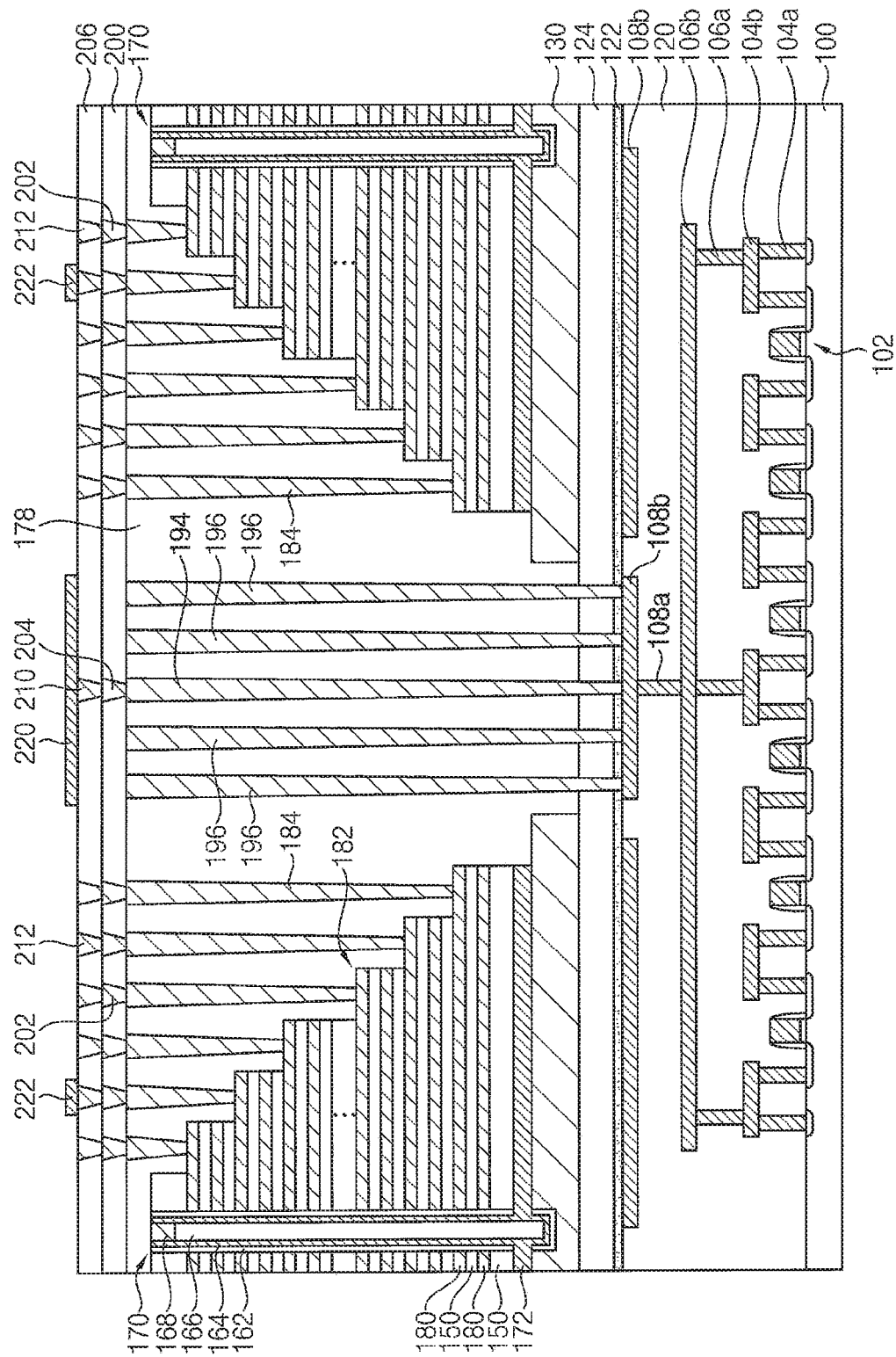

The vertical memory device shown in FIG. 13 is substantially the same as the vertical memory device shown in FIGS. 1A and 2, except for a shape of a third lower conductive pattern.

Referring to FIG. 13, bottoms of the through via contact 194 and the dummy through via contacts 196 may contact one third lower conductive pattern 108b.

Thus, bottoms of the through via contact 194 and the dummy through via contacts 196 may be connected to each other by the third lower conductive pattern 108b. However, a contact may not be formed on the dummy through via contact 196. As the dummy through via contact 196 is electrically floated, the dummy through via contact 196 and the lower transistors 102 may be electrically insulated from each other. Thus, electrical signals may not be transferred to the lower transistors 102 of the peripheral circuits by the dummy through via contact 196.

Figure 14:
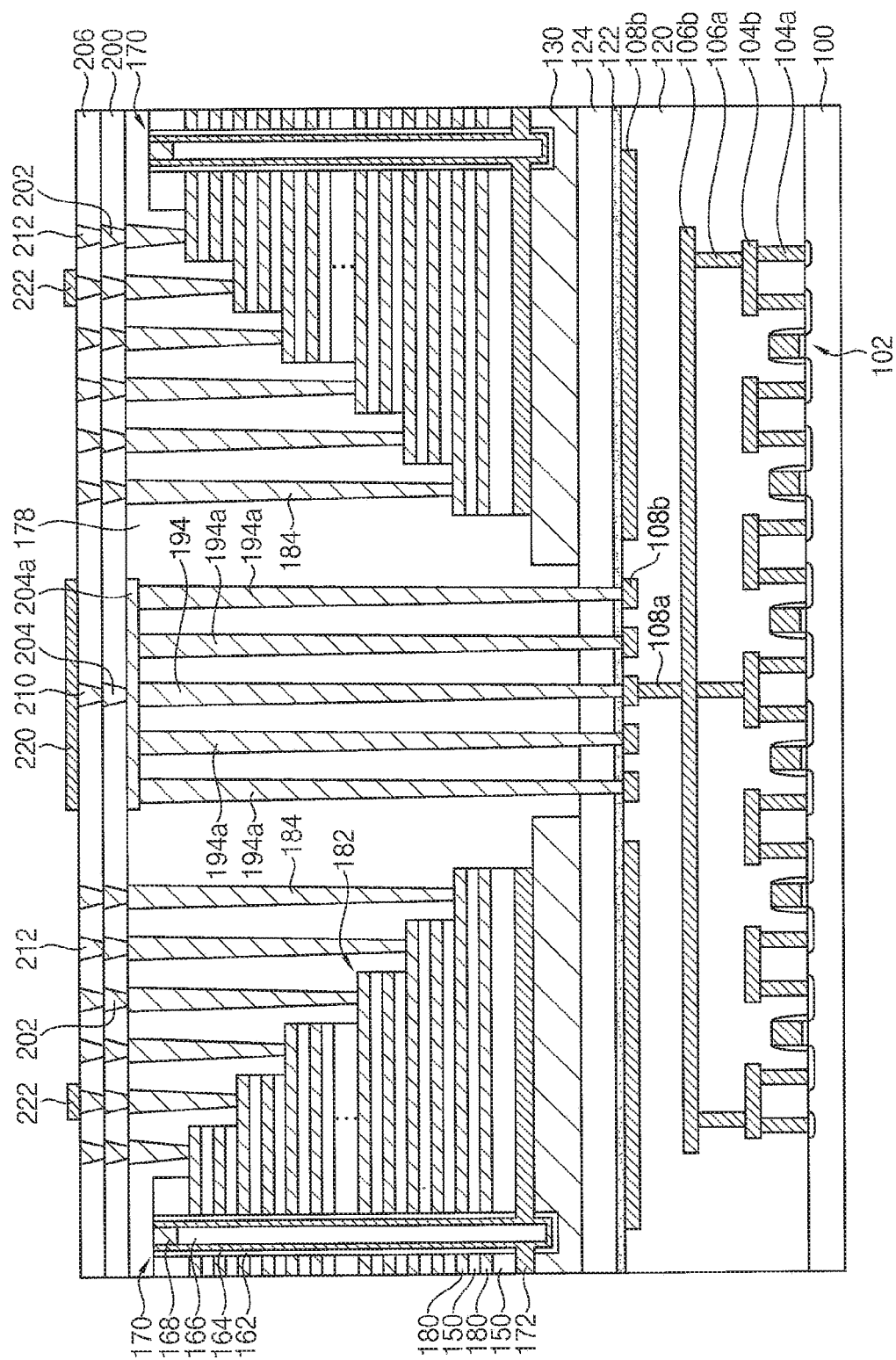

The vertical memory device shown in FIG. 14 is substantially the same as the vertical memory device shown in FIGS. 1A and 2, except that an upper connection pattern is further included.

Referring to FIG. 14, an upper connection pattern 204a may contact an upper surface of the through via contact 194 and an upper surface of the dummy through via contacts 194a. The upper connection pattern 204a may include a conductive material. Thus, the through via contact 194 and the dummy through via contacts 194a may be electrically connected to each other by the upper connection pattern 204a.

The first peripheral upper contact 204 may contact an upper surface of the upper connection pattern 204a.

As shown in FIG. 14, the dummy through via contact 194a may be electrically connected to the through via contact 194. In some embodiments, a connection wiring may not be disposed under the dummy through via contact 194a, and thus the dummy through via contact 194 will not be electrically connected to the lower transistor 102. In this case, although a defect of the through via contact 194 occurs, electrical signals may not be transferred to the lower transistor 102 of the peripheral circuits by the dummy through via contact 194a.

In some embodiments, a connection wiring may be disposed under the dummy through via contact 194a, and thus the dummy through via contact 194a may be electrically connected to the lower transistor 102. In this case, electrical signals may be transferred to the lower transistor 102 of the peripheral circuits by the dummy through via contact 194a. Therefore, the dummy through via contact 194a may serve as an auxiliary through via contact. That is, an electrical path may be provided by the dummy through via contact 194a. Thus, although a defect of the through via contact 194 occurs, an electrical failure may not occur.

Figure 15:
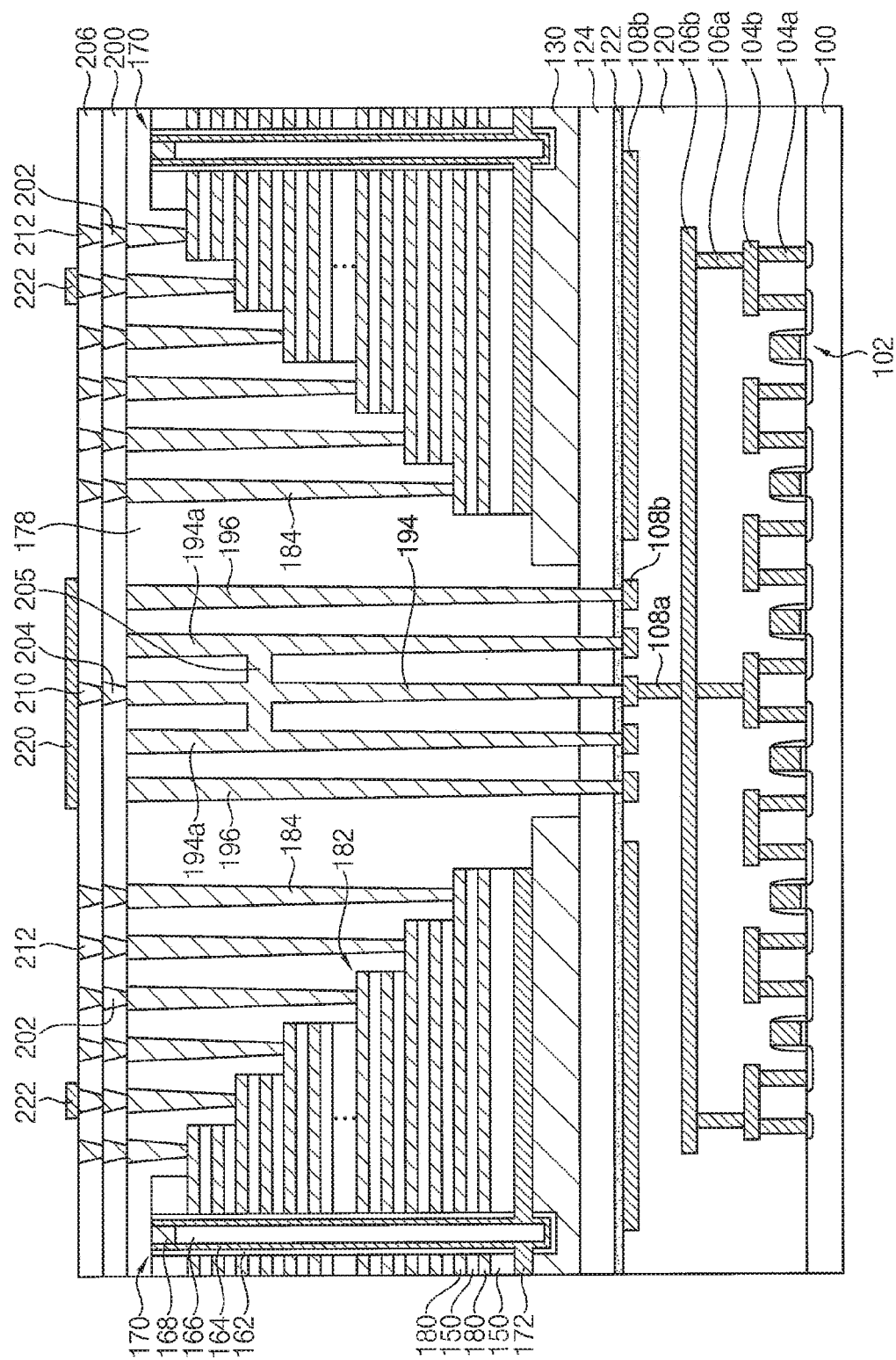

The vertical memory device shown in FIG. 15 is substantially the same as the vertical memory device shown in FIGS. 1A and 2, except that a connection pattern is further included.

Referring to FIG. 15, a connection pattern 205 may connect a sidewall of the through via contact 194 and a sidewall of the dummy through via contact 194a adjacent to the through via contact 194. The dummy through via contact may include a first dummy through via contact 194a and a second dummy through via contact 196. The first peripheral upper contact 204 may contact an upper surface of the through via contact 194.

In some embodiments, the connection pattern 205 may contact the sidewall of the through via contact 194 and the sidewall of the first dummy through via contact 194a. Therefore, the through via contact 194 and the first dummy through via contacts 194a may be electrically connected to each other by the connection pattern 205. However, the second dummy through via contact 196 and the through via contact 194 may not be connected by the connection pattern 205.

In some embodiments, a connection wiring may not be disposed under the first dummy through via contact 194a, and thus the first dummy through via contact 194a will not be electrically connected to the lower transistor 102. In this case, although a defect of the through via contact 194 occurs, electrical signals may not be transferred to the lower transistor 102 of the peripheral circuits by the first dummy through via contact 194a.

In some embodiments, a connection wiring may be disposed under the first dummy through via contact 194a, and thus the first dummy through via contact 194a may be electrically connected to the lower transistor 102. In this case, electrical signals may be transferred to the lower transistor 102 of the peripheral circuits by the first dummy through via contact 194a. Therefore, the first dummy through via contact 194a may serve as an auxiliary through via contact. However, electrical signals may not be transferred to the lower transistor 102 of the peripheral circuits by the second dummy through via contact 196.

Figure 16:
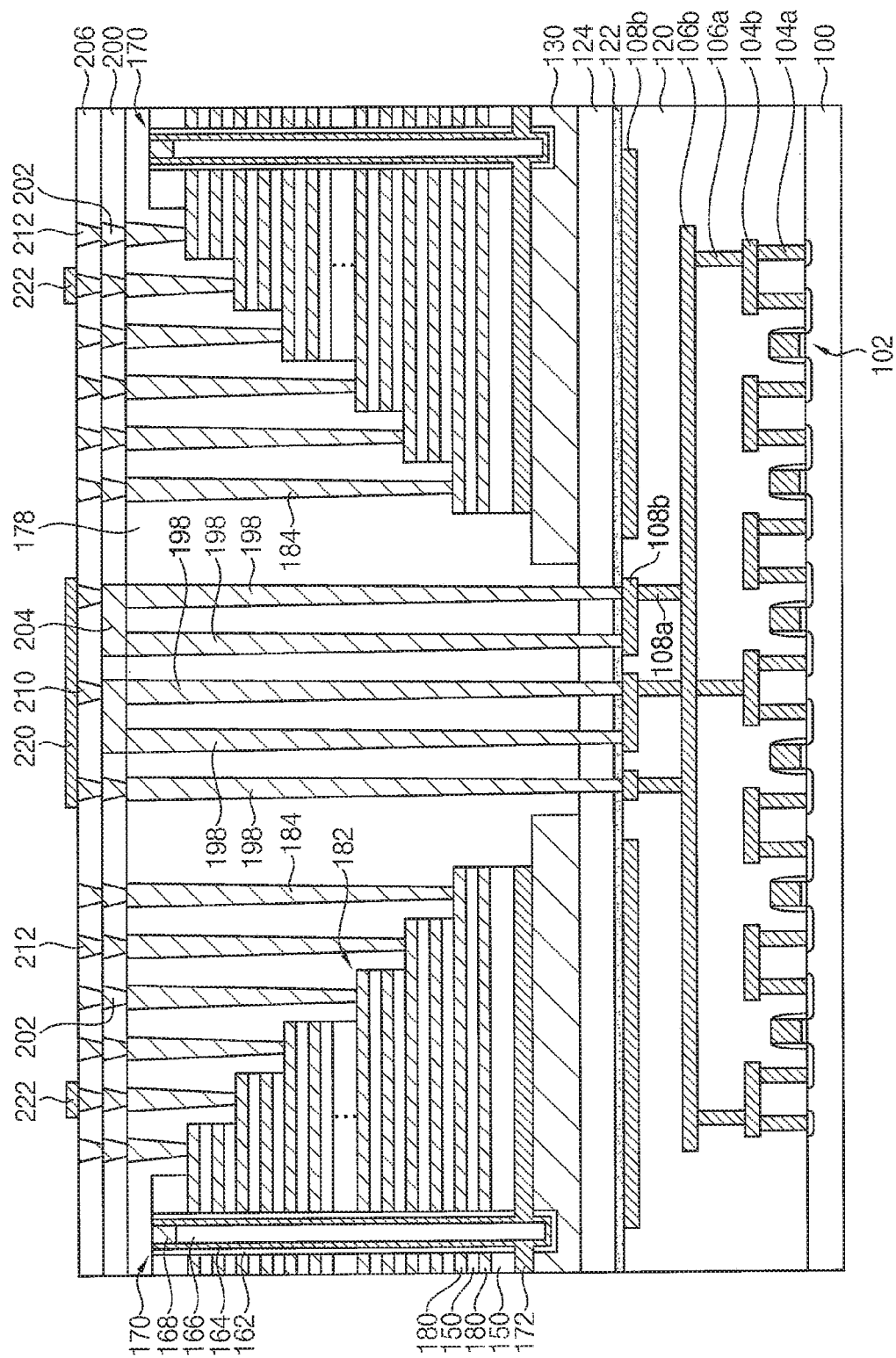

The vertical memory device shown in FIG. 16 is substantially the same as the vertical memory device shown in FIGS. 1A and 2, except that a plurality of through via contacts are included and a dummy through via contact is not included.

Referring to FIG. 16, a plurality of through via contacts 198 may pass through the first insulating interlayer 178 covering a region between the cell stack structures 182, and a second lower insulating interlayer 124 and an etch stop layer 122 therebelow. The through via contacts 198 may contact the third lower conductive pattern 108b.

In some embodiments, the plurality of through via contacts 198 may contact one of third lower conductive patterns 108b. In some demonstrative embodiments, one of the through via contacts 198 may contact one of third lower conductive patterns 108b.

A lower surface of the third lower conductive pattern 108b contacting the through via contacts 198 may contact a third lower contact plug 108a.

A first peripheral upper contact 204 may contact upper surfaces of the plurality of through via contacts 198. In some embodiments, one through via contact 198 may contact a bottom of one first peripheral upper contact 204. In some embodiments, a plurality of through via contacts 198 may contact a bottom of one first peripheral upper contact 204.

As the plurality of through via contacts 198 are provided, the not-open defects of the through via contacts 198 may be decreased. Also, an electrical path may be increased by the through via contacts 198. Thus, although defects of ones of the through via contacts 198 occur, electrical signals may be transferred to the lower transistor 102 of the peripheral circuits by normal through via contacts 198. Therefore, electrical failures of the vertical memory device may be decreased.

Figure 17:
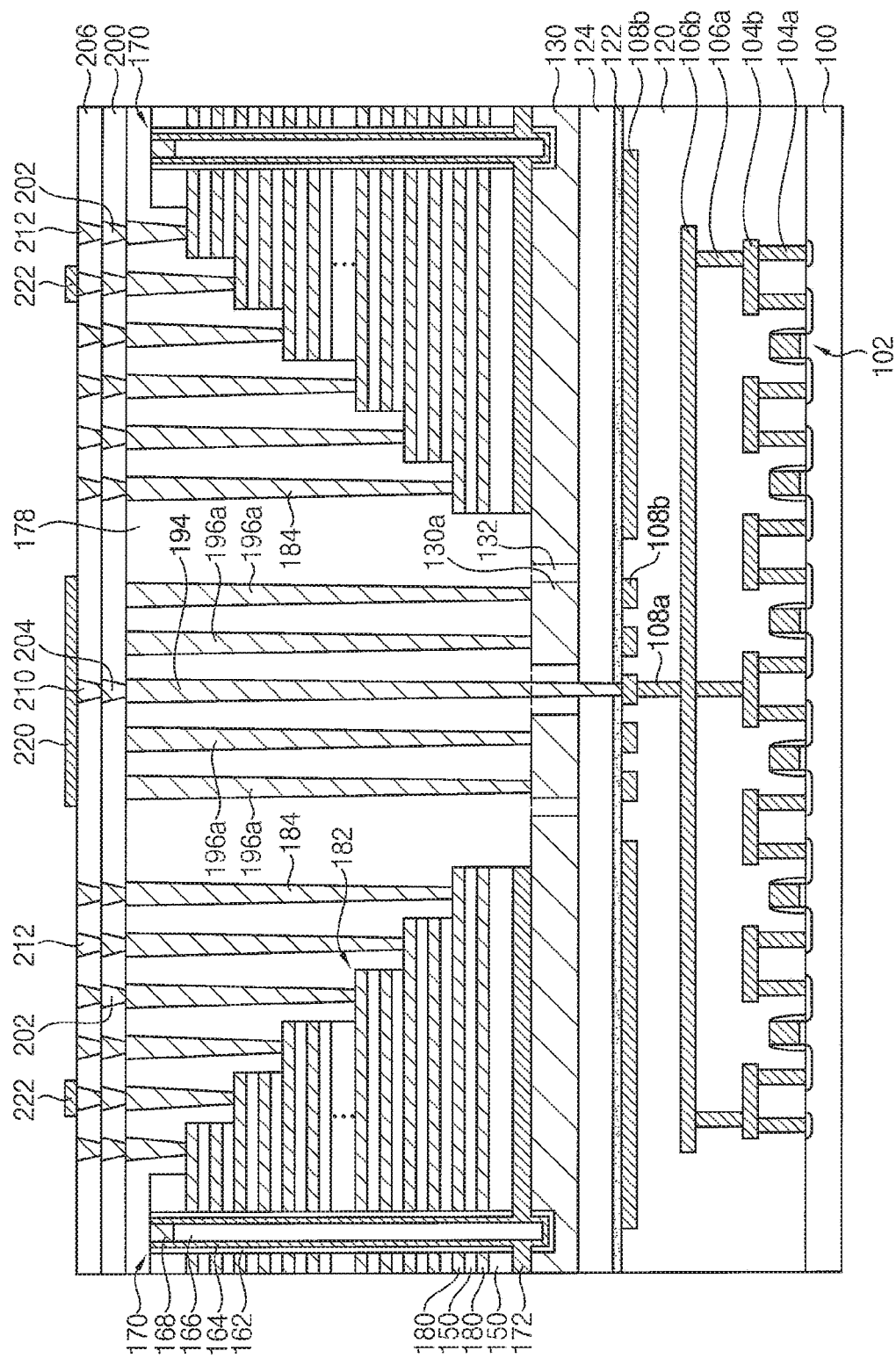
FIG. 17 is a cross-sectional diagram and FIG. 18 is plan diagram illustrating vertical memory devices according to embodiments of the inventive concept.
Figure 18:
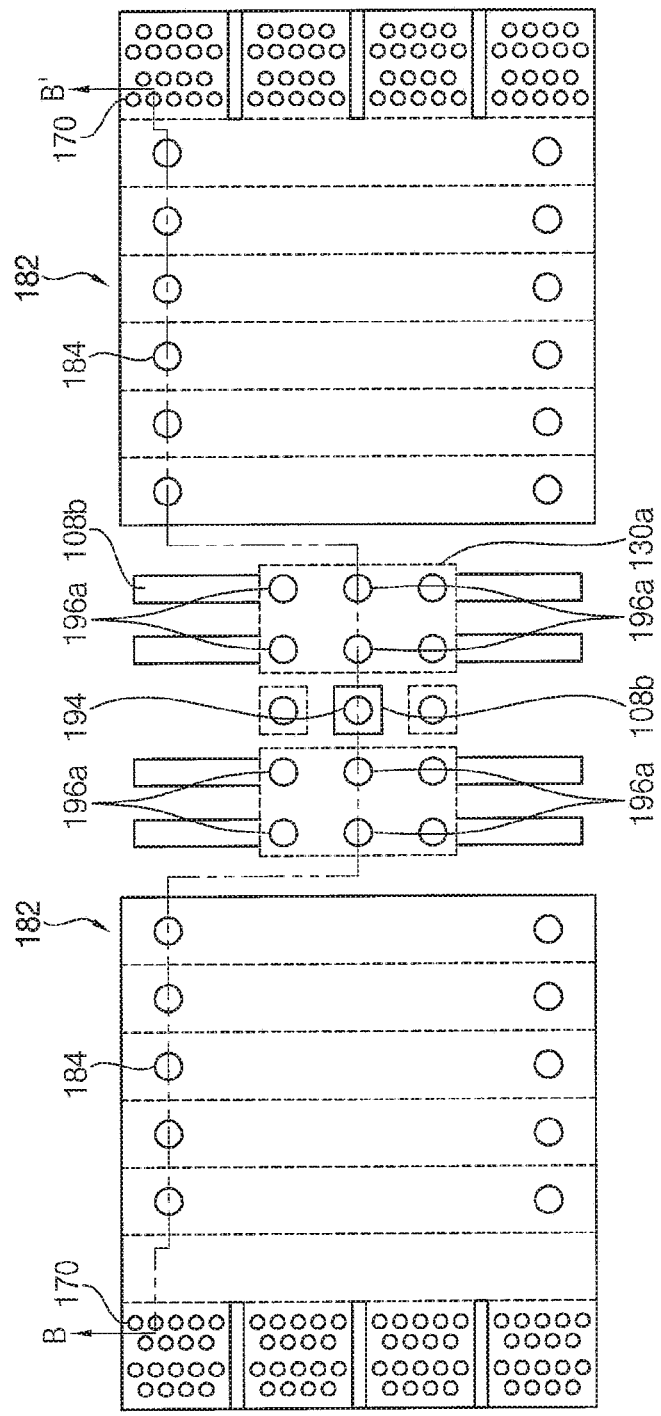

FIG. 18 is a plan diagram illustrating vertical memory devices according to embodiments of the inventive concept and FIG. 17 is a cross-sectional diagram taken along line B-B' of FIG. 18.

The vertical memory devices shown in FIGS. 17 and 18 are substantially the same as the vertical memory devices shown in FIGS. 1A and 2, except for base semiconductor patterns and a dummy through via contact.

Referring to FIGS. 17 and 18, base semiconductor patterns 130 may be formed on the second lower insulating interlayer 124 under the cell stack structures 182. Also, pad semiconductor patterns 130a may be formed on the second lower insulating interlayer 124 between the cell stack structures 182 in the first direction.

The pad semiconductor patterns 130a may serve as a pad pattern contacting a bottom of the dummy through via contact 196a. Thus, the pad semiconductor patterns 130a may be vertically opposed a portion for forming the dummy through via contact 196a. However, the pad semiconductor patterns 130a may not be disposed at a portion for forming the through via contact 194.

A first insulation pattern 132 may be formed between the pad semiconductor patterns 130a. The through via contact 194 may be disposed at the first insulation pattern 132 between the pad semiconductor patterns 130a.

Dummy through via contacts 196a may pass through the first insulating interlayer 178 between the cell stack structures 182, and the dummy through via contacts 196a may contact the upper surface of the pad semiconductor pattern 130a.

In some embodiments, a plurality of dummy through via contacts 196a may contact one of the pad semiconductor patterns 130a. In some embodiments, one of the dummy through via contacts 196a may contact one of the pad semiconductor patterns 130a.

The through via contact 194 may pass through the first insulating interlayer 178 between the cell stack structures 182, and the first insulation pattern 132, the second lower insulating interlayer 124 and the etch stop layer 122 therebelow. The through via contact 194 may contact the third lower conductive pattern 108b.

In some embodiments, one through via contact 194 and the plurality of dummy through via contacts 196a adjacent to the one through via contact 194 may be formed in the first insulating interlayer 178.

A height of the through via contact 194 may be greater than a height of the dummy through via contact 196a.

In some embodiments, an upper diameter of the through via contact 194 may be substantially the same as an upper diameter of the dummy through via contact 196a. In some embodiments, the upper diameter of the through via contact 194 may be different from the upper diameter of the dummy through via contact 196a.

A bottom of the dummy through via contact 196a may extend to an upper surface of the pad semiconductor pattern 130a, and the dummy through via contact 196a may not extend to the third lower conductive pattern 108b. Thus, electrical signals will not be transferred to the lower transistor 102 of the peripheral circuits by the dummy through via contact 196a.

Although the dummy through via contacts 196a are disposed, a layout of the third lower conductive pattern 108b under the dummy through via contacts 196a may not be limited by the dummy through via contacts 196a. For example, the third lower conductive pattern 108b including lines or patterns for transferring electrical signals may be also disposed at a portion facing the dummy through via contact 196a in the vertical direction. Therefore, a degree of freedom of the layout of the third lower conductive pattern 108b may be increased.

Figure 19:
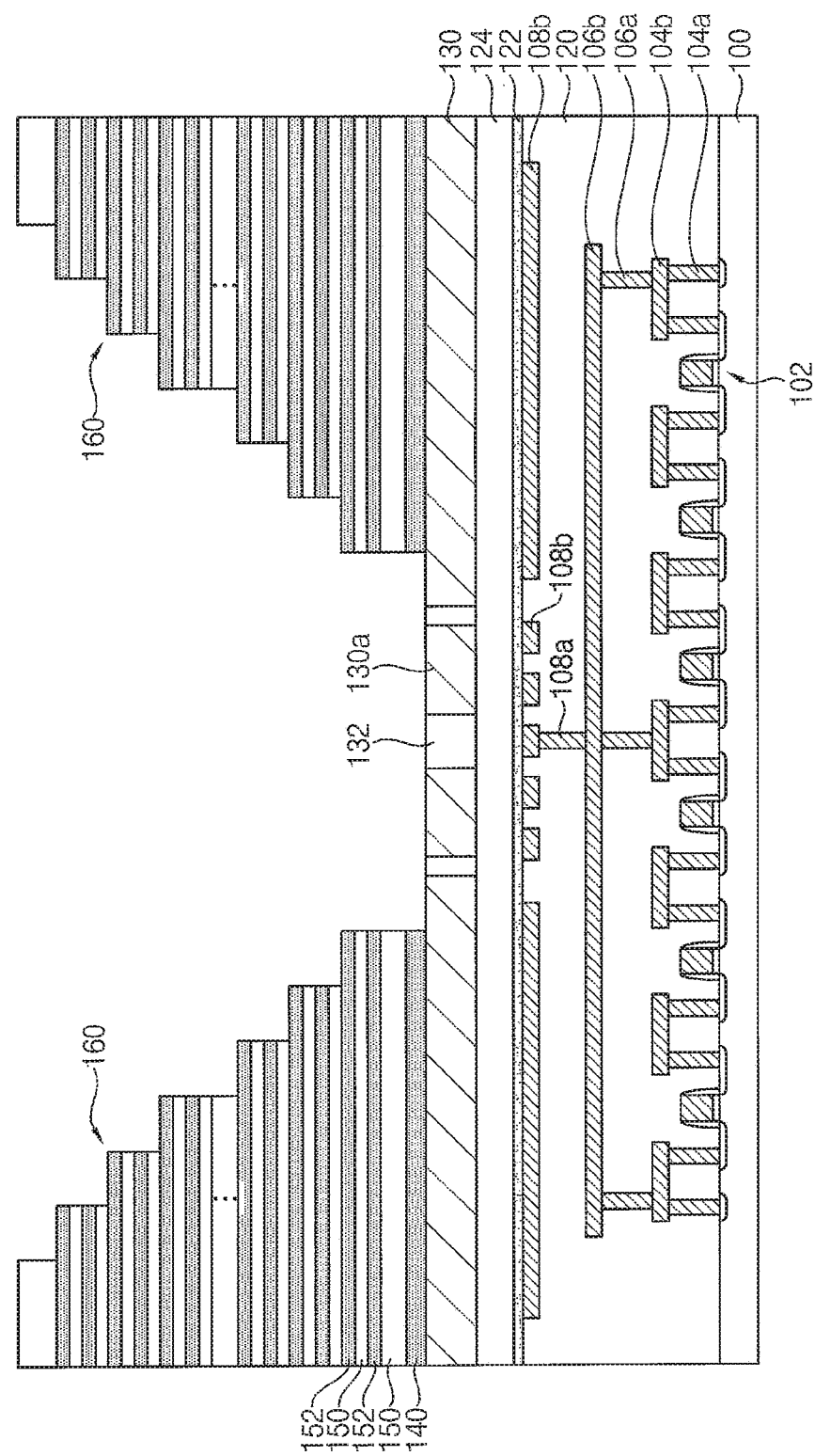
FIGS. 19, 20 and 21 are related cross-sectional diagrams illustrating in one example a method of manufacturing vertical memory devices according to embodiments of the inventive concept.
Figure 20:
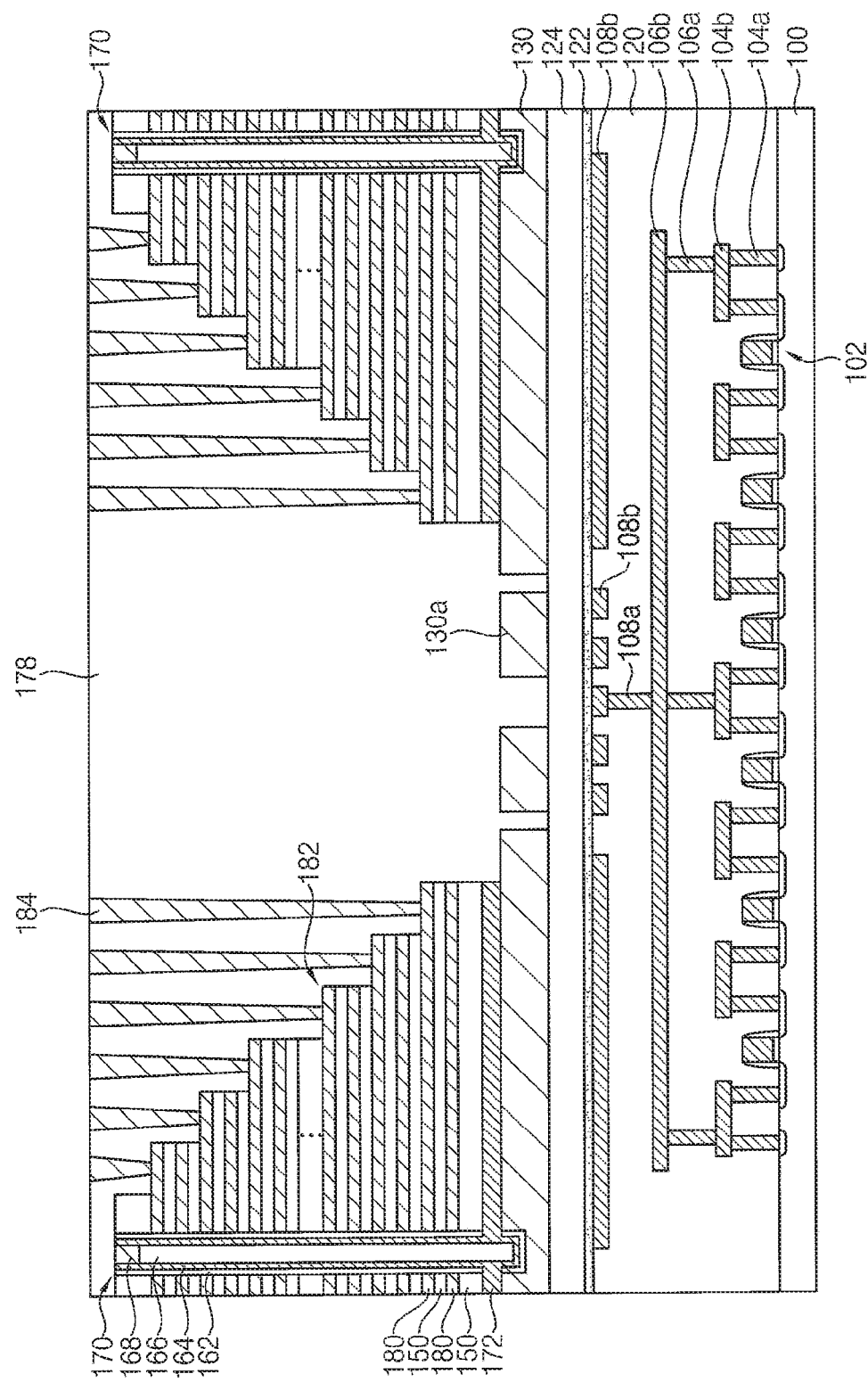
Figure 21:
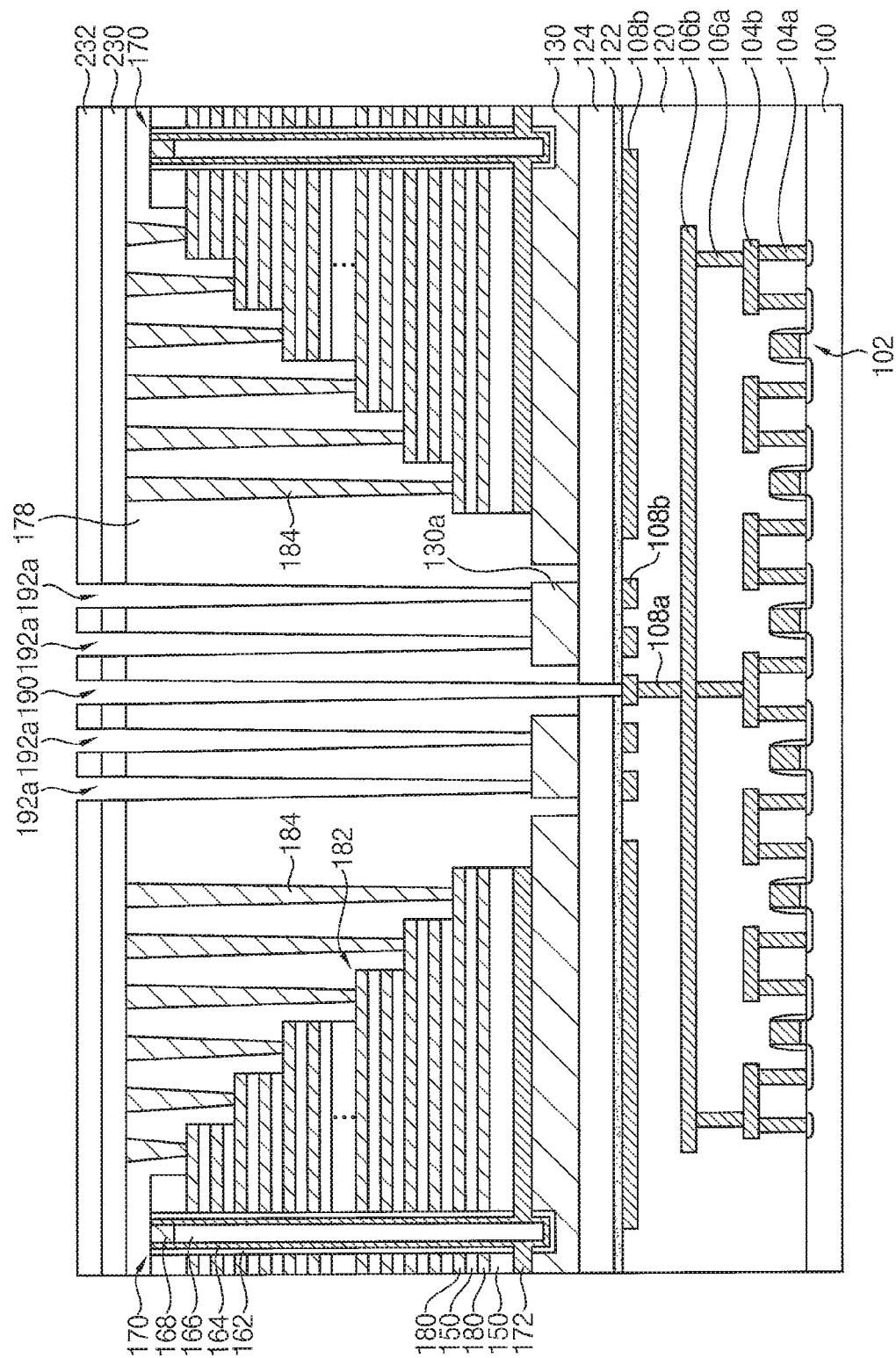

FIGS. 19, 20 and 21 are related, cross-sectional views illustrating in one example a method of manufacturing vertical memory devices according to embodiments of the inventive concept.

Referring to FIG. 19, circuit patterns constituting peripheral circuits may be formed on the substrate 100. A first lower insulating interlayer 120 may be formed to cover the circuit patterns. An etch stop layer 122 and a second lower insulating interlayer 124 may be formed on the first lower insulating interlayer 120.

Base semiconductor patterns 130 and pad semiconductor patterns 130a may be formed on the second lower insulating interlayer 124. A first insulation pattern 132 may be formed on the second lower insulating interlayer 124 to fill spaces between the base semiconductor patterns 130 and the pad semiconductor patterns. Upper surfaces of the base semiconductor patterns 130, the pad semiconductor patterns 130a, and the first insulation pattern 132 may be coplanar with each other.

In some embodiments, a polysilicon layer may be formed on the second lower insulating interlayer 124. The polysilicon layer may be patterned to form the base semiconductor patterns 130 and the pad semiconductor patterns 130a.

The base semiconductor pattern 130 may be disposed to oppose a portion for forming the cell stack structure 182. The pad semiconductor pattern 130a may be disposed between the base semiconductor patterns 130. The pad semiconductor pattern 130a may be disposed to oppose a portion for forming the dummy through via contact 196. However, the pad semiconductor pattern 130a may not be disposed at a portion for forming the through via contact 194. In addition, the first insulation pattern 132 may be disposed to oppose the portion for forming the through via contact 194.

Thereafter, mold structures 160 may be formed on the base semiconductor patterns 130.

Referring to FIG. 20, the processes previously described in relation to the embodiments of FIGS. 5, 6 and 7 may be performed.

That is, a second insulation layer may be formed on the mold structures 160, and the base semiconductor pattern 130, the pad semiconductor pattern 130a and the second lower insulating interlayer 124 between the mold structures 160. A third insulation layer may be formed on the second insulation layer. Therefore, a first insulating interlayer 178 including the first insulation pattern, the second insulation layer and the third insulation layer may be formed to cover the mold structures 160.

Thereafter, the channel connection pattern 172 and the channel structure 170 may be formed in the mold structure. Also, the mold structures 160 may be replaced into cell stack structures 182. An edge portion in the first direction of the cell stack structure 182 may have a stair-stepped shape. Cell contact plugs 184 may be formed through the first insulating interlayer 178. The cell contact plugs 184 may contact upper surfaces of the gate electrodes 180 of the cell stack structure 182, respectively.

Referring to FIG. 21, the first insulating interlayer 178 between the cell stack structures 182 may be etched to form dummy through via holes 192*a* exposing an upper surface of the pad semiconductor pattern 130*a*. The first insulating interlayer 178, the second lower insulating interlayer 124, and the etch stop layer 122 between the cell stack structures 182 may be sequentially etched to form a through via hole 190 exposing an upper surface of the third lower conductive pattern 108*b*.

More particularly, a hard mask layer may be formed on the first insulating interlayer 178 and the cell contact plug 184. Thereafter, a photoresist layer may be coated on the hard mask layer, and a photoresist process may be performed to form a photoresist pattern 188. The photoresist pattern 188 may include openings at portions for forming the through via holes 190 and the dummy through via holes 192*a*.

The hard mask layer may be etched using the photoresist pattern 188 as an etch mask to form a hard mask 186.

Thereafter, the first insulating interlayer 178, the second lower insulating interlayer 124, and the etch stop layer 122 between the cell stack structures 182 may be sequentially etched using the hard mask 186 as an etch mask. In the etching process, the pad semiconductor pattern 130*a* may be hardly etched, so that the pad semiconductor pattern 130*a* may be exposed by a bottom of the dummy through via hole 192*a*. Further, the through via hole 190 may pass through a portion between the pad semiconductor patterns 130*a*, so that an upper surface of the third lower conductive pattern 108*b* may be exposed by a bottom of the through via hole 190.

Referring to back to FIG. 17, a conductive material may be used to fill the through via hole 190 and the dummy through via holes 192*a* to respectively form a through via contact 194 in the through via hole 190 and a dummy through via contact 196 in the dummy through via hole 192*a*. Subsequently, the same processes previously described in relation to the embodiments of FIGS. 10 and 11 may be performed to form the vertical memory device of FIG. 17.

Figure 22:
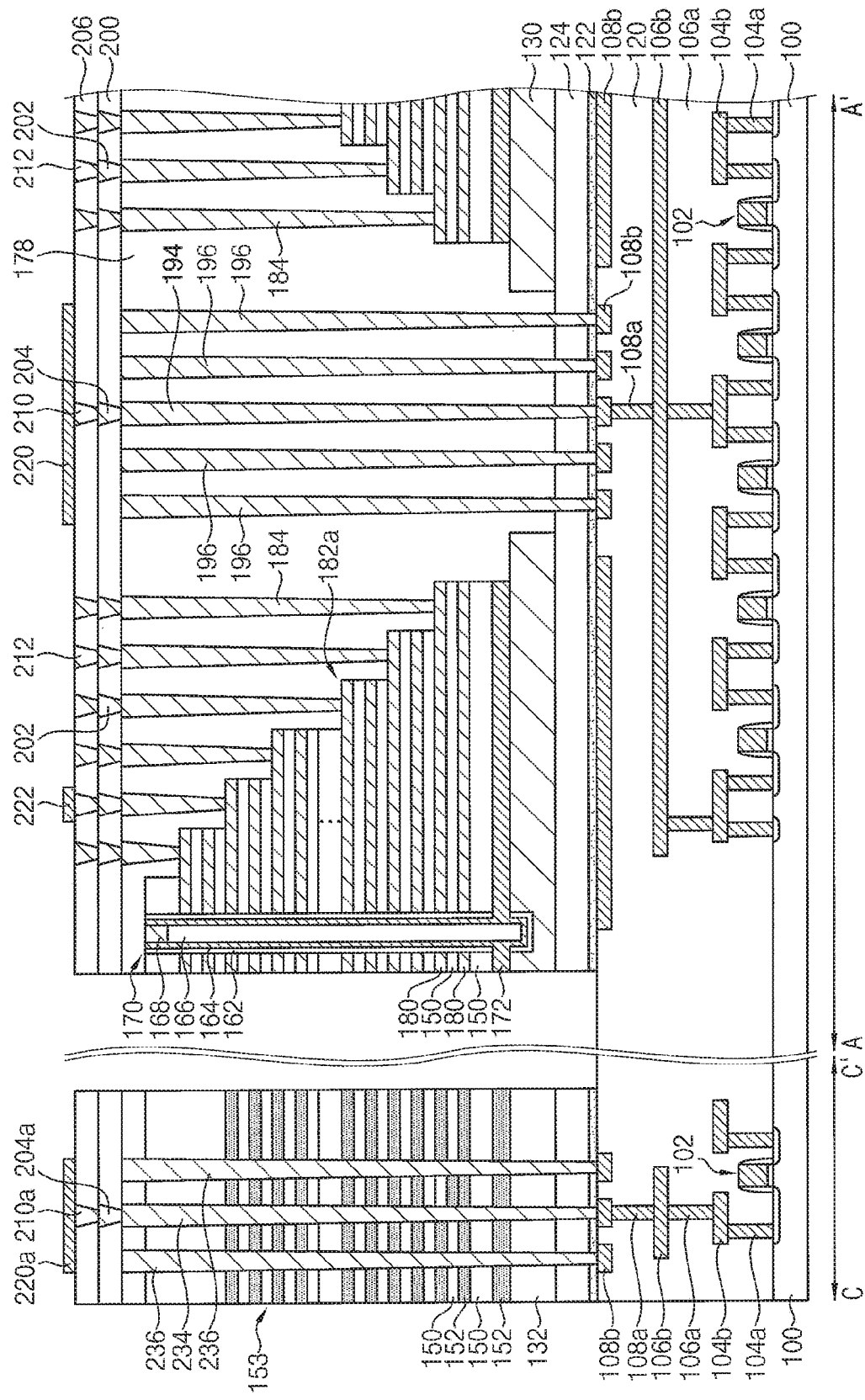
FIG. 22 is a sectional diagram and FIG. 23 is a plan diagram illustrating vertical memory devices according to embodiments of the inventive concept.
Figure 23:
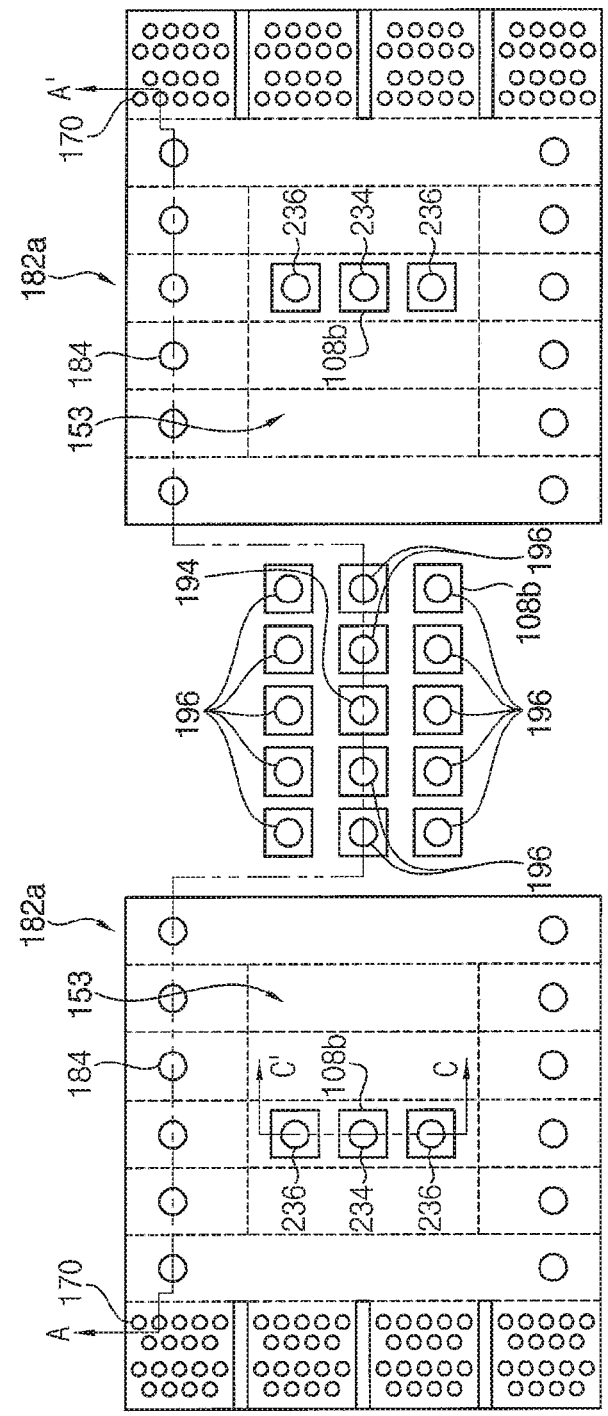

FIG. 22 is a sectional diagram and FIG. 23 is a plan diagram illustrating vertical memory devices according to embodiments of the inventive concept. Here, FIG. 22 shows cross sections respectively taken along lines A-A' and C-C' of FIG. 23.

The vertical memory devices shown in FIGS. 22 and 23 are substantially the same as the vertical memory devices shown in FIGS. 1A and 2, except for a cell stack structure, a second through via contact, and a second dummy through via contact.

Referring to FIGS. 22 and 23, the vertical memory device may include circuit patterns on the substrate 100, and cell stack structures 182*a*, a channel structure 170, a cell contact plug 184, a first through via contact 194, a second through via contact 234, a first dummy through via contact 196, and a second dummy through via contact 236 over the circuit patterns.

The third lower conductive patterns 108*b* in lower wirings connected to the peripheral circuits may serve as pad patterns for contacting of the first through via contact 194, the second through via contact 234, the first dummy through via contact 196 and the second dummy through via contact 236. Thus, each of the third lower conductive patterns 108*b* may be vertically opposed to one of portions forming the first through via contact 194, the second through via contact 234, the first dummy through via contact 196, and the second dummy through via contact.

The first through via contact 194 may be substantially the same as the through via contact illustrated with reference to FIGS. 1A and 2. The first dummy through via contact 196 may be substantially the same as the dummy through via contact illustrated with reference to FIGS. 1A and 2. The second through via contact 234 and the second dummy through via contact 236 may be vertically opposed to a mold portion 153 of a pad region of the cell stack structure 182*a*.

An opening between the base semiconductor patterns 130 may be formed at a portion vertically facing the mold portion 153 of the pad region of the cell stack structure. That is, the base semiconductor pattern 130 may not be disposed at the portion vertically facing the mold portion 153 of the pad region of the cell stack structure 182*a*, and the first insulation pattern 132 may be disposed at the portion vertically facing the mold portion 153 of the pad region of the cell stack structure 182*a*.

The cell stack structure 182*a* including a plurality of memory cells may be formed on the base semiconductor pattern 130. An edge portion in the first direction of the cell stack structure 182*a* may have a stair-stepped shape. In the cell stack structure 182*a*, a portion having the stair-stepped shape is referred to as a pad region, and a portion having no stair-stepped shape is referred to as a cell region.

The cell region of the cell stack structure 182*a* may be substantially the same as the cell region of the cell stack structure illustrated with reference to FIGS. 1A and 2.

The pad region of the cell stack structure 182*a* may include an extension portion and the mold portion 153. The extension portion may include the gate electrodes 180 extend to the pad region from the cell region. Thus, the extension portion may include the gate electrodes 180 and the insulation patterns 150 alternately stacked in the vertical direction.

The mold portion 153 may not include the gate electrodes 180. That is, the mold portion 153 may include the sacrificial patterns 152 and the insulation patterns 150 alternately stacked in the vertical direction. The sacrificial pattern 152 may include silicon nitride.

In some embodiments, the mold portion 153 may be disposed at a central portion of the pad region. The extension portion may surround the mold portion 153. The extension portion may be disposed at edge portions in the first and second directions of the pad region.

A first insulating interlayer 178 may cover the cell stack structures 182*a*, and the second lower insulating interlayer 124 and the base semiconductor patterns 130 between the cell stack structures 182*a*.

Cell contact plugs 184 may pass through the first insulating interlayer 178 disposed on the pad region of the cell stack structure 182*a*, and the cell contact plugs 184 may contact edge portions of upper surfaces of each gate electrodes 180. The cell contact plugs 184 may contact the gate electrodes 180 in the extension portion.

The first through via contact 194 may pass through the first insulating interlayer 178 covering a region between the cell stack structures 182*a*, and the second lower insulating interlayer 124 and the etch stop layer 122 therebelow. The first through via contact 194 may contact the third lower conductive pattern 108*b*. The first dummy through via contact 196 may pass through the first insulating interlayer 178 covering the region between the cell stack structures 182*a*, and the second lower insulating interlayer 124 and the etch stop layer 122 therebelow. The first dummy through via contact 196 may contact the third lower conductive pattern 108*b*.

The second through via contact 234 may pass through the mold portion 153 of the pad region of the cell stack structure 182*a*, and the first insulation pattern 132, the second lower insulating interlayer 124 and the etch stop layer 122 therebelow. The second through via contact 234 may contact the third lower conductive pattern 108*b*. The second dummy through via contact 236 may pass through the mold portion 153 of the pad region of the cell stack structure 182*a*, and the first insulation pattern 132, the second lower insulating interlayer 124 and the etch stop layer 122 therebelow. The second dummy through via contact 236 may contact the third lower conductive pattern 108*b*. The second dummy through via contact 236 may be adjacent to the second through via contact 234.

In some embodiments, the third lower conductive pattern 108*b* contacting the second through via contact 234 may be electrically connected with the third lower contact plug 108*a*, the second lower conductive pattern 106*b*, the second lower contact plug 106*a*, the first lower conductive pattern 104*b* and the first lower contact plug 104*a*. Thus, the third lower conductive pattern 108*b* contacting the second through via contact 234 may be electrically connected to the lower transistor 102 of the peripheral circuits.

In some embodiments, the bottom of the third lower conductive pattern 108*b* contacting the second dummy through via contact 236 may not be connected to the third lower contact plug 108*a*. Therefore, the third lower conductive pattern 108*b* contacting the second dummy through via contact 236 will not be electrically connected to the peripheral circuits.

A first cell upper contact 202 and first peripheral upper contacts 204 and 204*a* may pass through the second insulating interlayer 200. The first cell upper contact 202 may contact an upper surface of the cell contact plug 184. The first peripheral upper contacts 204 and 204*a* may contact upper surfaces of the first and second through via contacts 194 and 234.

Upper contacts may not be formed on upper surfaces of the first and second dummy through via contacts 196 and 236. That is, the upper surfaces of the first and second dummy through via contacts 196 and 236 may only contact an insulation material, e.g., the second insulating interlayer 200. Thus, electrical signals may not be transferred to the lower transistor 102 of the peripheral circuits by the first and second dummy through via contacts 196 and 236.

Figure 24:
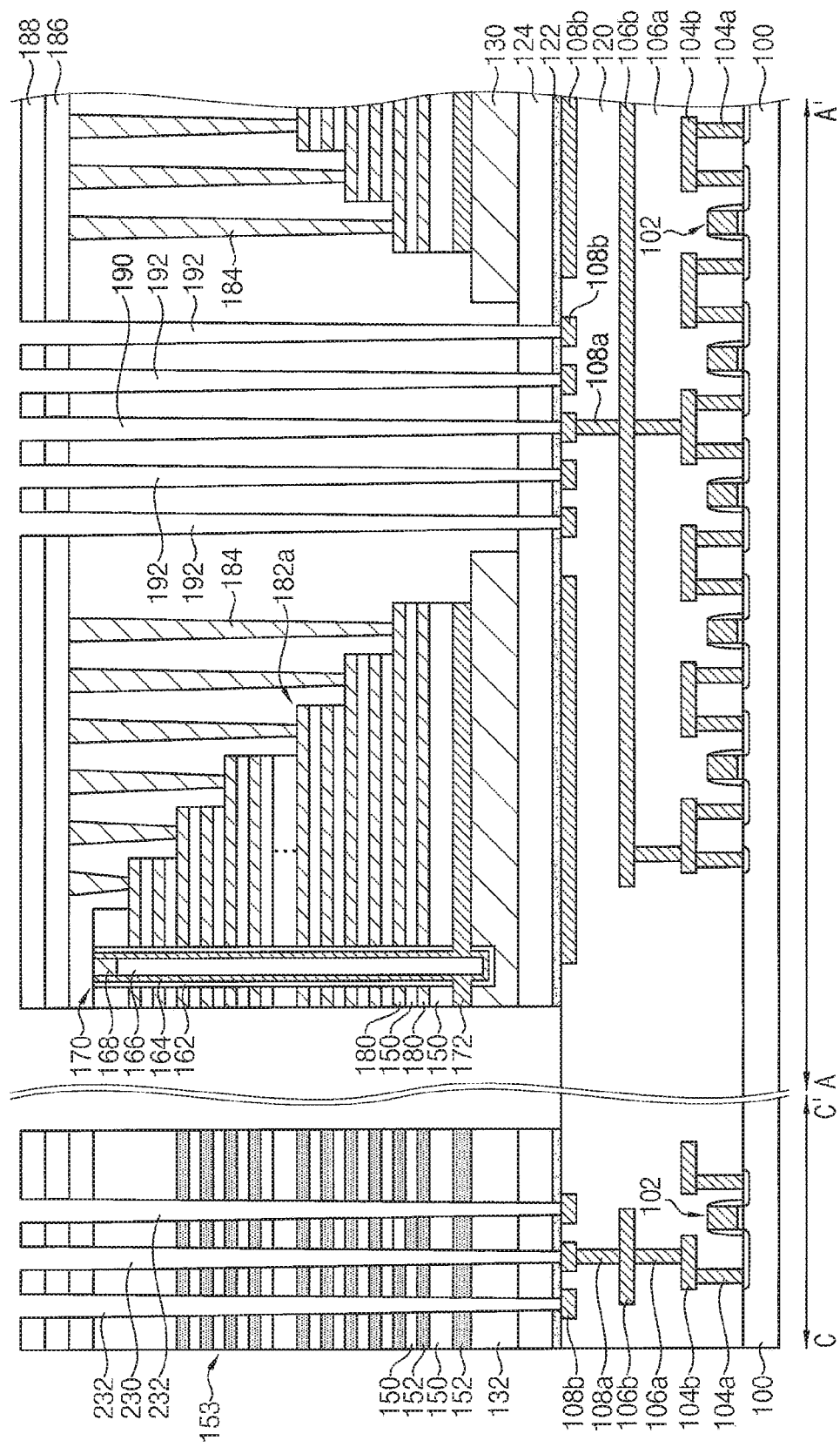
FIGS. 24, 25 and 26 are respective, cross-sectional diagrams variously illustrating vertical memory devices and/or methods of manufacturing vertical memory devices according to embodiments of the inventive concept.

FIG. 24 is a cross-sectional view illustrating in one example a method of manufacturing vertical memory devices according to embodiments of the inventive concept.

Initially, the processes previously described in relation to the embodiments of FIGS. 3, 4, 5, 6 and 7 may be performed. However, during the process described in relation to FIG. 6, the sacrificial patterns included in the pad region of the mold structure may be partially removed to form gaps between the insulation patterns in the vertical direction. Thereafter, a conductive material may fill the gaps to form the gate electrodes in the gaps. Thus, the mold structure may be replaced into the cell stack structure. The pad region of the cell stack structure may include a mold portion and a pad portion.

Referring to FIG. 24, the first insulating interlayer 178, the second lower insulating interlayer 124 and the etch stop layer 122 between the cell stack structures 182*a* may be sequentially etched to form the first through via hole 190 and the first dummy through via hole 192. In addition, the mold portion 153 of the pad region of the cell stack structure 182*a*, and the first insulation pattern 132, the second lower insulating interlayer 124 and the etch stop layer 122 therebelow may be sequentially etched to form the second through via hole 230 and the second dummy through via hole 232. That is, the first through via hole 190, the first dummy through via hole 192, the second through via hole 230, and the second dummy through via hole 232 may be formed by the same etching process.

Thereafter, the processes previously described in relation to the embodiments of FIGS. 9, 10 and 11 may be used to complete the vertical memory devices shown in FIGS. 22 and 23.

Figure 25:
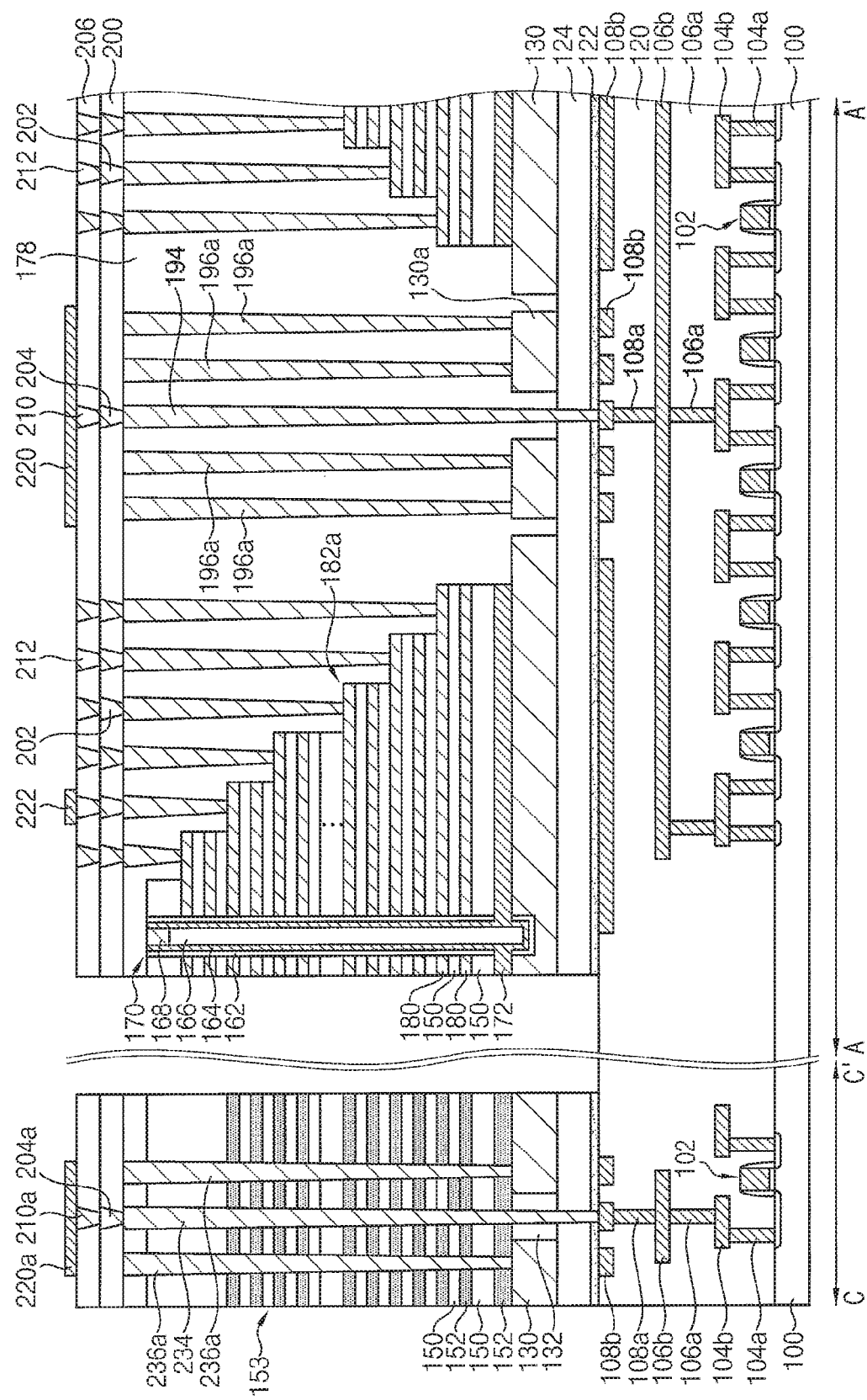

FIG. 25 is a cross-sectional view illustrating vertical memory devices according embodiments of the inventive concept.

The vertical memory device shown in FIG. 25 is substantially the same as the vertical memory device shown in FIG. 22, except for the base semiconductor pattern and the first and second dummy through via contacts.

Referring to FIG. 25, pad semiconductor patterns 130*a* may be disposed at portions facing bottoms of the first and second dummy through via contacts 196*a* and 236*a*, respectively. That is, the pad semiconductor patterns 130*a* may be formed on the second lower insulating interlayer 124 between the cell stack structures 182*a* in the first direction. Further, the pad semiconductor patterns 130*a* may be formed on the second lower insulating interlayer 124 facing the mold portion 153 of the pad region of the cell stack structure 182*a*. The first insulation pattern 132 may be formed between the pad semiconductor patterns 130*a*.

The first through via contact 194 may pass through the first insulating interlayer 178 covering the region between the cell stack structures 182*a*, and the second lower insulating interlayer 124 and the etch stop layer 122 therebelow. The first through via contact 194 may contact the third conductive pattern 108*b*. The first dummy through via contacts 196*a* may pass through the first insulating interlayer 178 covering the region between the cell stack structures 182*a*. The first dummy through via contacts 196*a* may contact an upper surface of the pad semiconductor pattern 130*a*.

The first through via contact 194 may be substantially the same as the through via contact illustrated with reference to FIG. 22. The first dummy through via contact 196*a* may be the same as the dummy through via contact described with reference to FIG. 22.

The second through via contact 234 may pass through the mold portion 153 of the pad region of the cell stack structure 182*a*, and the first insulation pattern 132, the second lower insulating interlayer 124 and the etch stop layer 122 therebelow. The second through via contact 234 may contact the third lower conductive pattern 108*b*. The second dummy through via contact 236*a* may pass through the mold portion 153 of the pad region of the cell stack structure 182*a*. The second dummy through via contact 236*a* may contact the upper surface of the pad semiconductor pattern 130*a*. The second dummy through via contact 236a may be adjacent to the second through via contact 234.

Figure 26:
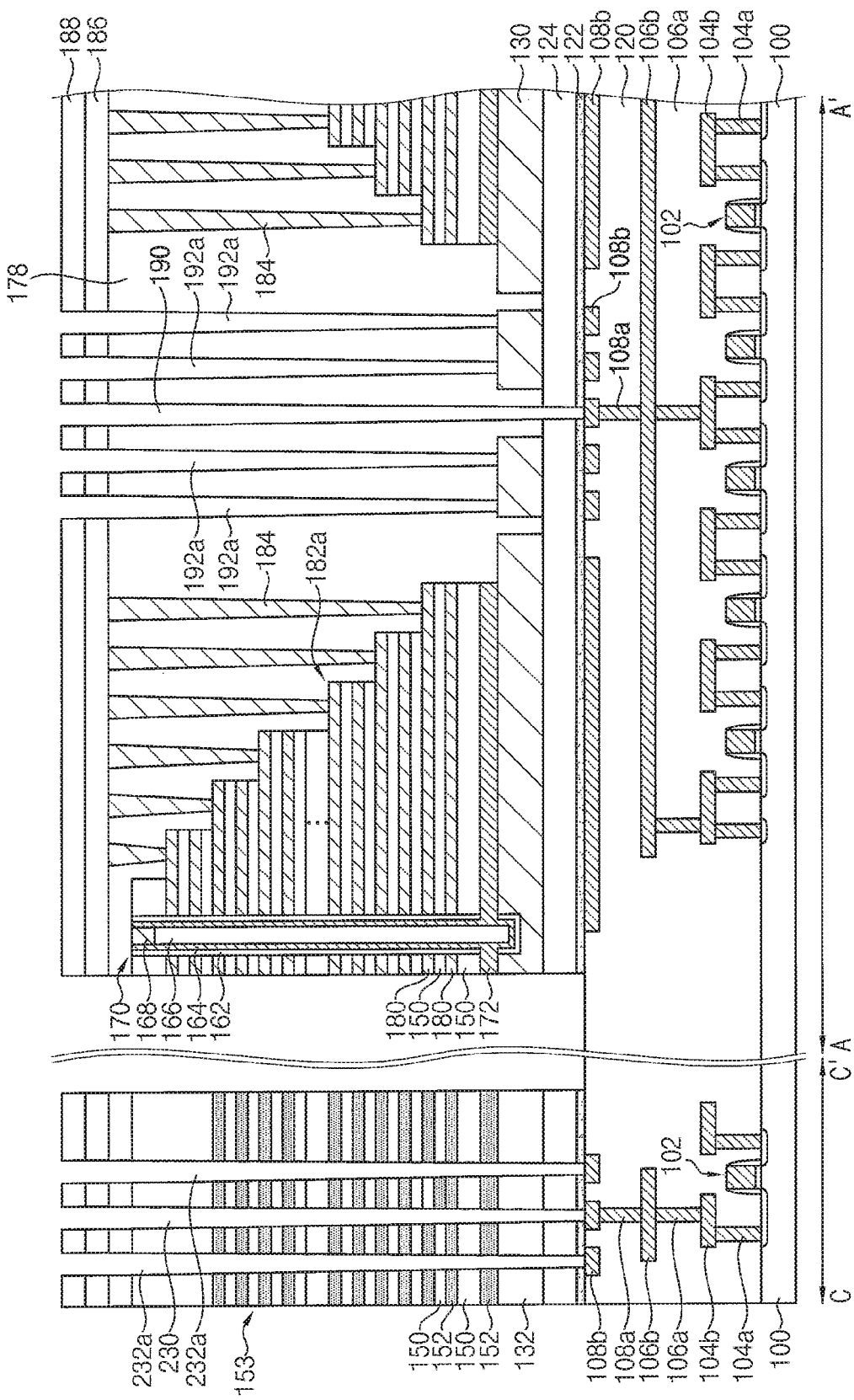

FIG. 26 is a cross-sectional view illustrating in one example a method of manufacturing vertical memory devices according to embodiments of the inventive concept.

Here again, the processes previously described in relation to the embodiments of FIGS. 3 to 7 may be substantially performed. However, during the process described in relation to FIG. 6, sacrificial layers of the pad region of the mold structure may be partially removed to form gaps between the insulation layers in the vertical direction. Thereafter, a conductive material may fill the gaps to form gate electrodes in the gaps. The mold structure may be replaced into a cell stack structure. Therefore, the pad region of the cell stack structure may include a mold portion and a pad portion.

Referring to FIG. 26, the first insulating interlayer 178 between the cell stack structures 182a may be etched to form first dummy through via holes 192a exposing an upper surface of the pad semiconductor pattern 130a. The first insulating interlayer 178, the second lower insulating interlayer 124 and the etch stop layer 122 between the cell stack structures 182a may be sequentially etched to form a first through via hole 190 exposing an upper surface of the third lower conductive pattern 108b.

In addition, the mold portion 153 of the pad region of the cell stack structure 182a may be etched to form a second dummy through via hole 232a exposing the pad semiconductor pattern 130a. The mold portion 153 of the pad region of the cell stack structure 182a, and the first insulation pattern 132, the second lower insulating interlayer 124, and the etch stop layer 122 therebelow may be etched to form a second through via hole 232a exposing the third lower conductive pattern 108b. The first and second through via holes 190 and 230 and the first and second dummy through via holes 192a and 232a may be formed by the same etching process.

Thereafter, the processes previously described in relation to the embodiments of FIGS. 9, 10 and 11 may be used to complete the vertical memory device of FIG. 26.

The inventive concept is not limited to only the illustrated embodiments set forth above. Rather, those skilled in the art will readily appreciate that many modifications are possible without materially departing from the scope of the inventive concept. Accordingly, all such modifications are deemed to fall within the scope of the inventive concept, as defined in the following claims.

What is claimed is:

1. A vertical memory device, comprising:
   circuit patterns of peripheral circuits on a substrate, the circuit patterns including a lower conductive pattern;
   cell stack structures over the circuit patterns and spaced apart in a first horizontal direction, wherein each of the cell stack structures includes gate electrodes spaced apart in a vertical direction;
   a first insulating interlayer covering the cell stack structures and a portion between the cell stack structures;
   a through via contact passing through the first insulating interlayer between the cell stack structures to contact an upper surface of the lower conductive pattern;
   at least one dummy through via contact passing through the first insulating interlayer between the cell stack structures and disposed adjacent to the through via contact; and
   upper wiring on the through via contact.

2. The vertical memory device of claim 1, wherein lower wiring is connected to the lower conductive pattern contacting a bottom of the through via contact, and the lower wiring is not connected to the lower conductive pattern contacting a bottom of the at least one dummy through via contact.

3. The vertical memory device of claim 1, wherein the at least one dummy through via contact includes a plurality of dummy through via contacts respectively disposed adjacent to the through via contact.

4. The vertical memory device of claim 3, wherein dummy through via contacts among the plurality of dummy through via contacts are respectively disposed in a pointwise symmetric pattern around the through via contact.

5. The vertical memory device of claim 1, wherein a ratio between an upper diameter of the through via contact and a distance between the through via contact and the at least one dummy through via contact is in a range of about 1:0.5 to 10.

6. The vertical memory device of claim 1, wherein the through via contact has an aspect ratio of between about 30 to 200:1 based on a lower diameter of the through via contact, and
   the at least one dummy through via contact has an aspect ratio of between about 30 to 200:1 based on a lower diameter of the at least one dummy through via contact.

7. The vertical memory device of claim 1, wherein an upper diameter of the through via contact is substantially the same as an upper diameter of the at least one dummy through via contact.

8. The vertical memory device of claim 1, wherein a bottom of the at least one dummy through via contact is in contact with an upper surface of the lower conductive pattern.

9. The vertical memory device of claim 1, wherein a bottom of the at least one dummy through via contact is disposed higher than an upper surface of the lower conductive pattern.

10. The vertical memory device of claim 1, further comprising:
    base semiconductor patterns on respective bottoms of the cell stack structures,
    wherein the through via contact and the at least one dummy through via contact are disposed between the base semiconductor patterns.

11. The vertical memory device of claim 1, further comprising:
    base semiconductor patterns on respective bottoms of the cell stack structures,
    wherein the through via contact is disposed between the base semiconductor patterns, and the at least one dummy through via contact is in contact with an upper surface of one of the base semiconductor patterns.

12. The vertical memory device of claim 1, wherein a height of the through via contact is in a range of about 3 μm to 20 μm.

13. The vertical memory device of claim 1, wherein the upper wiring includes a plurality of upper contacts contacting an upper surface of the through via contact and an upper conductive pattern contacting an upper surface of an uppermost one of the upper contacts.

14. The vertical memory device of claim 13, wherein an upper surface of the at least one dummy through via contact is in contact with a lowermost one of the upper contacts, and the lowermost one of the upper contacts is electrically insulated from the upper conductive pattern.

15. The vertical memory device of claim 1, wherein an upper surface of the at least one dummy through via contact contacts an insulation material, and the upper wiring is not formed on the at least one dummy through via contact.

16. The vertical memory device of claim 1, further comprising:

another through via contact insulated from the gate electrodes, passing through one of the cell stack structures to contact an upper surface of the lower conductive pattern and electrically connect to a lower transistor; and another at least one dummy through via contact insulated from the gate electrodes, passing through the one of the cell stack structures, and electrically insulated from the lower transistor.

17. A vertical memory device, comprising:

circuit patterns including a lower conductive pattern;

cell stack structures over the circuit patterns and spaced apart in a first horizontal direction, wherein each of the cell stack structures includes gate electrodes spaced apart in a vertical direction;

a first insulating interlayer covering the cell stack structures and a portion between the cell stack structures;

a through via contact passing through the first insulating interlayer between the cell stack structures to contact an upper surface of the lower conductive pattern and electrically connect to a lower transistor;

at least one dummy through via contact disposed adjacent to the through via contact, passing through the first insulating interlayer between the cell stack structures and electrically insulated from the lower transistor; and an upper wiring on the through via contact, wherein a ratio of an upper diameter of the through via contact and a distance between the through via contact and the at least one dummy through via contact is in a range of about 1:0.5 to 10.

18. The vertical memory device of claim 17 wherein an upper surface of the at least one dummy through via contact is in contact with an insulation material.

19. The vertical memory device of claim 17, wherein the through via contact has an aspect ratio of between about 30 to 200:1 based on a lower diameter of the through via contact, and the at least one dummy through via contact has an aspect ratio of between about 30 to 200:1 based on a lower diameter of the at least one dummy through via contact.

20. The vertical memory device of claim 17, wherein the at least one dummy through via contact includes a plurality of dummy through via contacts respectively disposed adjacent to the through via contact in a pointwise symmetric pattern.

* * * * *